US008680917B2

(12) United States Patent
Kimura

(10) Patent No.: US 8,680,917 B2
(45) Date of Patent: Mar. 25, 2014

(54) ANALOG CIRCUIT AND DISPLAY DEVICE AND ELECTRONIC DEVICE

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/890,313

(22) Filed: May 9, 2013

(65) Prior Publication Data

US 2013/0240891 A1 Sep. 19, 2013

Related U.S. Application Data

(60) Division of application No. 13/666,090, filed on Nov. 1, 2012, now Pat. No. 8,441,315, which is a division of application No. 12/851,217, filed on Aug. 5, 2010, now Pat. No. 8,305,138, which is a division of application No. 11/254,791, filed on Oct. 21, 2005, now Pat. No. 7,773,058, which is a continuation of application No. 10/719,023, filed on Nov. 24, 2003, now Pat. No. 6,958,651.

(30) Foreign Application Priority Data

Dec. 3, 2002 (JP) ................................ 2002-351685

(51) Int. Cl.
*H03F 1/14* (2006.01)
(52) U.S. Cl.
USPC ............................................ 330/51; 330/264

(58) Field of Classification Search
USPC ............................................. 330/51, 264, 267
See application file for complete search history.

(56) References Cited

U.S. PATENT DOCUMENTS

| 4,015,212 A | 3/1977 | Miyata |
| 4,264,872 A | 4/1981 | Suzuki |
| 4,518,926 A | 5/1985 | Swanson |

(Continued)

FOREIGN PATENT DOCUMENTS

| EP | 0190973 A3 | 8/1986 |
| EP | 0899712 A2 | 3/1999 |

(Continued)

OTHER PUBLICATIONS

Y. Kida et al.; "LN-4: A 3.8 inch Half-VGA Transflective Color TFT-LCD with Completely Integrated 6-bit RGB Parallel Interface Drivers"; Eurodisplay 2002; pp. 831-834; 2002.

*Primary Examiner* — Henry Choe
(74) *Attorney, Agent, or Firm* — Fish & Richardson P.C.

(57) ABSTRACT

The invention provides an analog circuit that decreases an effect of variation of a transistor. By flowing a bias current in a compensation operation, a voltage between the gate and source of the transistor to be compensated is held in a capacitor. In a normal operation, the voltage stored in the compensation operation is added to a signal voltage. As the capacitor holds the voltage according to the characteristics of the transistor to be compensated, the effect of variation can be decreased by adding the voltage stored in the capacitor to the signal voltage. Further, an analog circuit which decreases the effect of variation can be provided by applying the aforementioned basis to a differential circuit, an operational amplifier and the like.

21 Claims, 35 Drawing Sheets

(56) References Cited

U.S. PATENT DOCUMENTS

| | | | |
|---|---|---|---|
| 4,577,162 A | 3/1986 | Peterson |
| 4,626,794 A | 12/1986 | Sugimoto |
| 4,694,341 A | 9/1987 | Soneda et al. |
| 4,697,154 A | 9/1987 | Kousaka et al. |
| 4,781,437 A | 11/1988 | Shields et al. |
| 5,061,920 A | 10/1991 | Nelson |
| 5,103,218 A | 4/1992 | Takeda |
| 5,196,738 A | 3/1993 | Takahara et al. |
| 5,266,936 A | 11/1993 | Saitoh |
| 5,274,284 A | 12/1993 | Krenik et al. |
| 5,296,696 A | 3/1994 | Uno |
| 5,361,041 A | 11/1994 | Lish |
| 5,365,199 A | 11/1994 | Brooks |
| 5,572,153 A | 11/1996 | Vallancourt et al. |
| 5,739,805 A | 4/1998 | Dingwall |
| 5,739,816 A | 4/1998 | Kobayashi et al. |
| 5,900,856 A | 5/1999 | Iino et al. |
| 5,907,314 A | 5/1999 | Negishi et al. |
| 5,977,940 A | 11/1999 | Akiyama et al. |
| 5,995,072 A | 11/1999 | Nakajima |
| 6,181,314 B1 | 1/2001 | Nakajima et al. |
| 6,313,819 B1 | 11/2001 | Maekawa et al. |
| 6,498,438 B1 | 12/2002 | Edwards |
| 6,545,656 B1 | 4/2003 | Yamazaki |
| 6,611,107 B2 | 8/2003 | Mikami et al. |
| 6,707,336 B2 | 3/2004 | Reber |
| 6,738,037 B1 | 5/2004 | Akimoto |
| 6,777,888 B2 | 8/2004 | Kondo |
| 6,784,865 B2 | 8/2004 | Akimoto et al. |
| 6,791,613 B2 | 9/2004 | Shinohara et al. |
| 6,801,186 B2 | 10/2004 | Han et al. |
| 7,095,991 B2 | 8/2006 | Tsuchi et al. |
| 7,405,720 B2 | 7/2008 | Nakajima et al. |
| 7,719,363 B2 | 5/2010 | Wong |
| 8,063,699 B2 * | 11/2011 | Fan et al. ........................ 330/51 |
| 8,253,446 B2 | 8/2012 | Kimura et al. |

FOREIGN PATENT DOCUMENTS

| | | |
|---|---|---|
| EP | 0899714 A2 | 3/1999 |
| JP | 55-072863 A | 6/1980 |
| JP | 61-131171 U | 8/1986 |
| JP | 03-139908 B2 | 6/1991 |
| JP | 10-289993 A | 10/1998 |
| JP | 11-073163 A | 3/1999 |
| JP | 11-073165 A | 3/1999 |
| JP | 2001-085989 A | 3/2001 |
| WO | WO 02/075709 A1 | 9/2002 |

* cited by examiner

ANALOG CIRCUIT AND DISPLAY DEVICE AND ELECTRONIC DEVICE

CROSS-REFERENCE TO RELATED APPLICATIONS

This application is a divisional of U.S. application Ser. No. 13/666,090, filed Nov. 1, 2012, now allowed, which is a divisional of U.S. application Ser. No. 12/851,217, filed Aug. 5, 2010, now U.S. Pat. No. 8,305,138, which is a divisional of U.S. application Ser. No. 11/254,791, filed Oct. 21, 2005, now U.S. Pat. No. 7,773,058, which is a continuation of U.S. application Ser. No. 10/719,023, filed Nov. 24, 2003, now U.S. Pat. No. 6,958,651, which claims the benefit of a foreign priority application filed in Japan as Serial No. 2002-351685 on Dec. 3, 2002, all of which are incorporated by reference.

BACKGROUND OF THE INVENTION

1. Field of the Invention

The present invention relates to an analog circuit technology. More specifically, the invention relates to a circuit technology to decrease an effect of variation of current characteristics of transistors.

2. Description of the Related Art

In recent years, a display device having a thin film transistor (TFT) formed on a glass substrate is widely used. For example, a liquid crystal display (LCD) having in each pixel a TFT formed by using amorphous (non-crystalline) silicon is in widespread use in a notebook personal computer or a portable device and the like.

The TFT formed by using amorphous silicon, however, has low mobility. Therefore, it cannot flow much current. In view of the aforementioned, a TFT formed by using polycrystalline silicon is formed on a glass substrate instead. By using the polycrystalline silicon TFT that has high mobility, it is possible to integrate a driver circuit on the glass substrate. A driver circuit is typically implemented with a digital circuit, however, it is also under study to implement an analog circuit as well aiming at the realization of System-on-Panel in which various circuits are mounted on a glass substrate.

A structure of a source follower circuit as an example of the analog circuit is described now. FIG. 21 shows a circuit diagram of a source follower circuit. An input voltage Vi is inputted to a gate terminal 4308 of a transistor TR1. A bias voltage Vb is applied to a gate terminal 4309 of a transistor TR2. A voltage between the gate and source of the transistor TR1 is denoted as Vgs1. It is assumed for simplicity that a potential of a power supply on the low potential side (Vss) is 0 V. Then, a voltage of a source terminal 4310 of the transistor TR1 (an output voltage Vo) satisfies the following formula (1).

Formula 1 $V_o = V_i - V_{gs1}$ (1)

It is also assumed for simplicity that current characteristics and sizes (gate length L and gate width W) of the transistors TR1 and TR2 are identical here. The transistors TR1 and TR2 are connected in series, therefore, the same amount of current flows through each transistor. In the case where the transistors TR1 and TR2 both operate in a saturation region, the voltage Vgs1 between the gate and source of the transistor TR1 is equal to a voltage between the gate and source of the transistor TR2, that is the bias voltage Vb. Therefore, the following formula (2) is satisfied.

Formula 2 $V_o = V_i - V_b$ (2)

Although the sizes (gate length L and gate width W) of the transistors TR1 and TR2 are designed to be identical, actual sizes often vary when fabricated. Further, variation of gate insulating films in thickness or variation of crystallinity of channel formation regions lead to variation of the current characteristics of the transistor, for example threshold voltage or mobility.

It is assumed here as an example that a threshold voltage of the transistor TR1 is 2 V and that of the transistor TR2 is 3 V because of the variation. It should be noted that the transistor flows a current, which corresponds to a value that deducted a threshold voltage from a voltage between the gate and source thereof. In order that the transistor TR1 may flow the same amount of current as that flowing through the transistor TR2, a voltage between the gate and source of the transistor TR1 becomes 1 V lower because the threshold voltage thereof is 1 V lower. As a result, the output voltage Vo becomes 1 V higher, which is defined by Formulas 1 and 2 as compared to the case where the threshold voltage of the transistors TR1 and TR2 are equal.

As described above, the output voltage Vo varies when the current characteristics or the sizes of the transistors TR1 and TR2 vary.

In view of the aforementioned, a technology for making compensation for the variation is suggested. For example, a source follower circuit in which variation of transistors is compensated is reported (refer to Non-Patent Document 1).

FIG. 24 shows a circuit diagram of the aforementioned source follower circuit. The operation thereof is described now. First, switches 4401, 4406, and 4404 are turned ON among switches 4401 to 4406. Note that a switch becomes conductive when turned ON. An input voltage Vi is applied to an input terminal 4407. Subsequently, the switches 4401 and 4406 are turned OFF and the switch 4402 is turned ON. Then, a first offset voltage is stored in a capacitor 4409. Next, the switches 4402 and 4404 are turned OFF and the switch 4403 is turned ON. Then, a second offset voltage is stored in a capacitor 4410. As a result of the aforementioned operations, variation of the output voltage Vo is compensated.

Non-Patent Document 1

Euro Display 2002: p. 831: LN-4: A 3.8 inch Half-VGA Transflective Color TFT-LCD with Completely Integrated 6-bit RGB Parallel Interface Drivers When making compensation by using the aforementioned source follower circuit in FIG. 24, quite a few steps are required. That is, compensation is made by repeating ON/OFF of the switches 4401 to 4406. Therefore, it takes long time for making compensation until the original operation starts.

Additionally, a lot of switches and capacitors are required in the aforementioned source follower circuit, which occupy wider area for the layout and may lower the yield.

In other analog circuits as well as the source follower circuit, a normal operation may not be performed or an output may vary when current characteristics of transistors and the like vary.

In view of the aforementioned problems, the invention provides an electric circuit that suppresses an effect of variation of characteristics of transistors. More specifically, the invention provides an electric circuit for processing analog signals that allows a desired operation while suppressing an effect of variation of characteristics of transistors.

SUMMARY OF THE INVENTION

The invention employs an analog circuit having a configuration described below in view of the aforementioned problems.

The invention provides an analog circuit including a first transistor, a first capacitor, a first switch, a first terminal, a second terminal, a second transistor, a second capacitor, a second switch, a third terminal, and a fourth terminal. A gate terminal of the first transistor and one terminal of the first capacitor are electrically connected and a gate terminal of the second transistor and one terminal of the second capacitor are electrically connected and a source terminal of the first transistor and a source terminal of the second transistor are electrically connected. The first terminal and one terminal of the first capacitor are electrically connected via the first switch, and the third terminal and one terminal of the second capacitor is electrically connected via the second switch. The analog circuit of the invention further includes a unit to connect the other terminal of the first capacitor to either the second terminal or a source terminal of the first transistor electrically, and a unit to connect the other terminal of the second capacitor to either the fourth terminal or a source terminal of the second transistor electrically.

There are two operating states in the analog circuit of the aforementioned configuration. One is a compensation operation and the other is a normal operation. In the compensation operation, data for compensating the effect of variation of characteristics of transistors is obtained. Meanwhile in the normal operation, the data obtained in the compensation operation is added to an input signal to perform the original operation of the analog circuit. With the data obtained in the compensation operation added to the input signal in the normal operation, the effect of variation is decreased in the normal operation.

Further, the data obtained in the compensation operation is stored and used in the normal operation later. In this manner, a compensation operation does not have to be performed every time the normal operation is performed.

Next, a connection of a circuit in each operation is described.

Figure 22:
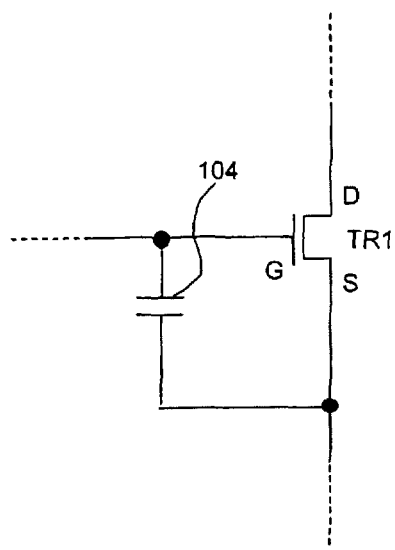
FIG. 22 is a diagram showing a configuration of a basic circuit of the invention.

FIG. 22 shows a connection of a circuit in the compensation operation. A capacitor 104 is disposed between the gate terminal and the source terminal of the transistor TR1. One terminal of the capacitor 104 and the gate terminal of the transistor TR1 are electrically connected, and the other terminal of the capacitor 104 and the source terminal of the transistor TR1 are electrically connected. As each terminal is electrically connected, a switch in ON-state, a passive element, or an active element may be disposed on the wirings between the terminals. It should be noted that referred to as a connection in this specification means an electrical connection. Therefore, there may be other elements (for example, other elements, a switch or the like) which enable electrical connection between the predetermined connections in the configuration disclosed in the invention. Further, each of the gate terminal, the drain terminal, and the source terminal of the transistor TR1 is electrically connected to other elements (such as a switch, an active element such as a transistor, or a passive element) or wirings.

The aforementioned connection corresponds to the connection in which the gate terminal of the first transistor and one terminal of the first capacitor are connected, the first terminal and one terminal of the first capacitor are connected, the other terminal of the first capacitor and the second terminal are not connected, and the other terminal of the first capacitor and the source terminal of the first transistor are connected.

In the aforementioned configuration, a current having a certain value flows between the drain and source of the transistor TR1. Note that the value may be an arbitrary value including zero. The capacitor 104 stores a voltage Vgs between the gate and source of the transistor TR1 through which the aforementioned current is flowing. The voltage Vgs between the gate and source of the transistor TR1 is dependent on the current flowing between the drain and source thereof. Therefore, when the current characteristic or the size of the transistor TR1 varies, the voltage Vgs between the gate and source of the transistor TR1 varies accordingly. It should be noted that the voltage Vgs between the gate and source of the transistor TR1 is dependent on the current flowing between the drain and source of the transistor TR1 even when the characteristic of the transistor TR1 varies.

In this manner, data for compensating for the effect of variation, that is the voltage between the gate and source of the transistor TR1 is obtained in the compensation operation.

Figure 23:
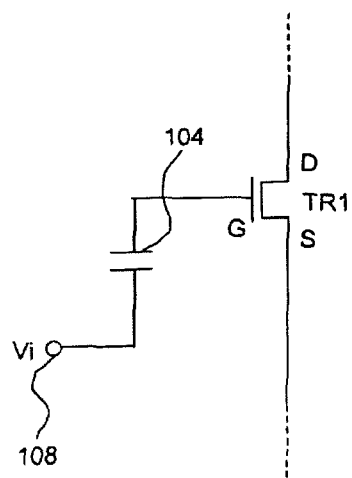
FIG. 23 is a diagram showing a configuration of a basic circuit of the invention.
Figure 24:
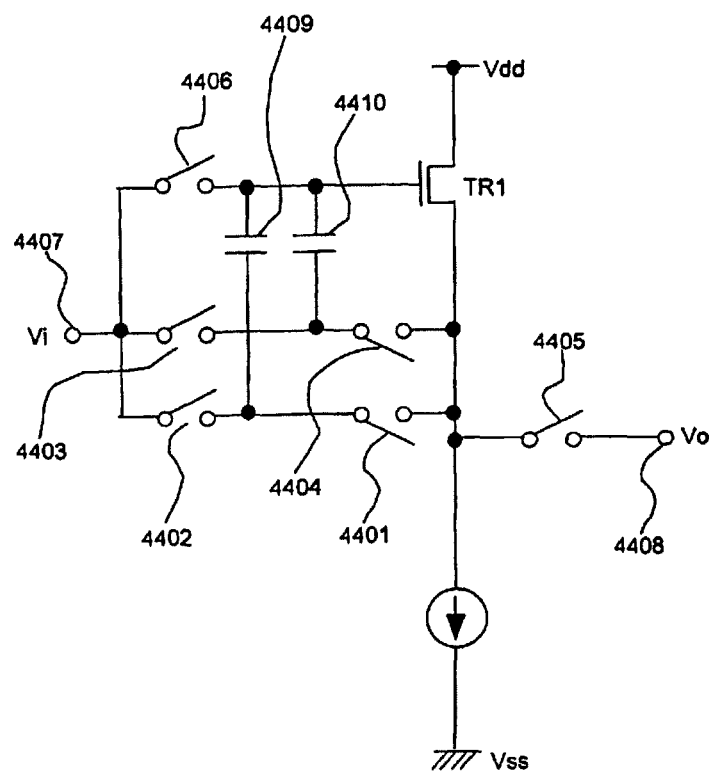
FIG. 24 is a diagram showing a configuration of a conventional source follower circuit.

FIG. 23 shows a connection of the circuit in the normal operation. The capacitor 104 is disposed between the gate terminal of the transistor TR1 and an input terminal 108. One terminal of the capacitor 104 and the gate terminal of the transistor TR1 are electrically connected, and the other terminal of the capacitor 104 and the input terminal 108 are electrically connected. An input voltage Vi is applied to the input terminal 108. The capacitor 104 stores a charge obtained in the compensation operation. Therefore, a voltage in which the voltage stored in the capacitor 104 is added to the input voltage Vi is applied to the gate terminal of the transistor TR1.

The aforementioned connection corresponds to the connection in which the gate terminal of the first transistor and one terminal of the first capacitor are connected and the first terminal and one terminal of the first capacitor are not connected. The other terminal of the first capacitor and the second terminal are connected and the other terminal of the first capacitor and the source terminal of the first transistor are not connected.

In this manner, the gate terminal of the transistor TR1 is not applied the input voltage Vi as it is, but the voltage in which the voltage stored in the capacitor 104 is added to the input voltage Vi. The voltage stored in the capacitor 104 is dependent on the current characteristic and the size of the transistor TR1. That is, the voltage stored in the capacitor 104 changes according to the variation of the current characteristic and the size of the transistor TR1. Thus, an effect of variation of the transistor TR1 can be decreased.

By making the aforementioned compensation to each transistor, variation of the circuit as a whole can be compensated. That is, by making compensation to the first transistor, the second transistor, or various transistors configuring the circuit, variation can be compensated.

Note that disposing a switch between certain terminals allows the electrical connection as shown in FIG. 22 in the compensation operation, and the electrical connection as shown in FIG. 23 in the normal operation. Several numbers of such switches may be disposed.

The transistor TR1 is an n-channel transistor in FIGS. 22 and 23, however, the invention is not exclusively limited to this and it may be a p-channel transistor as well. A p-channel transistor can be used as the transistor TR1 in the compensation operation by disposing the capacitor 104 between the gate and source thereof.

The compensation operation may be performed at least once before performing the normal operation. That is, the normal operation can be performed as long as an appropriate voltage is held in the capacitor 104. However, the charge stored in the capacitor 104 may change due to a noise or a leak current. In that case, a compensation operation is performed once again before the charge stored in the capacitor 104 changes drastically.

As described above, only once of the compensation operation can decrease the effect of variation of characteristics of transistors in the subsequent normal operation. Thus, drive timing is not made complicated and a simple operation can be obtained.

Furthermore, only the capacitor 104 may be provided as a capacitor, and a few numbers of switches may be provided, which occupies a small area for the layout. As a result, it is efficient for downsizing while preventing the drop in manufacturing yield.

It should be noted that the transistor in the invention may be any transistor formed by using any material, unit, or manufacturing method. For example, it may be a thin film transistor (TFT). The TFT may be formed by using a non-crystalline (amorphous), polycrystalline, or a single crystalline semiconductor layer. It may be a transistor formed on a single crystalline substrate, a SOI substrate, a plastic substrate, or a glass substrate. It may be a transistor formed by using organic compounds or carbon nanotube. It may also be a MOS transistor or a bipolar transistor.

The invention of the aforementioned configuration provides an analog circuit that includes a unit for supplying current which is electrically connected to the source terminal of the first transistor.

In this manner, by providing the unit for supplying current, a bias voltage of the analog circuit can be determined.

Further, the invention of the aforementioned configuration provides an analog circuit that includes a unit for interrupting the current flowing to the first transistor and a unit for interrupting the current flowing to the second transistor.

According to the aforementioned configuration, compensation operation can be performed separately to the first transistor and the second transistor.

Further, the invention of the aforementioned configuration provides an analog circuit in which the first terminal and the second terminal are electrically connected and the third terminal and the fourth terminal are electrically connected.

According to the aforementioned configuration, a wiring for supplying a voltage to the first terminal and the third terminal can be removed.

DETAILED DESCRIPTION OF THE INVENTION

Embodiment Mode 1

The invention can be applied to a variety of circuits such as an analog circuit including a differential circuit, an amplifier circuit, or an arithmetic circuit represented by an operational amplifier. In this embodiment mode, the differential circuit to which the invention is applied is described as an example.

Figure 1:
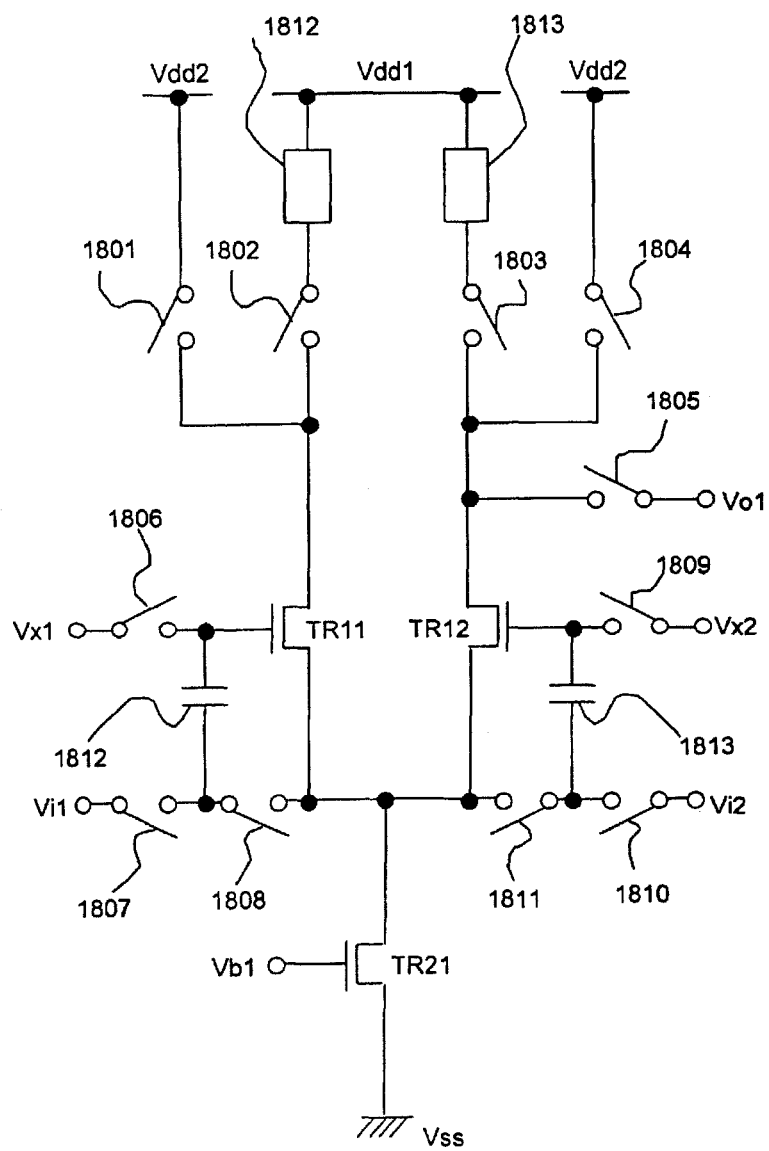
FIG. 1 is a diagram showing a configuration of a differential circuit of the invention.

FIG. 1 shows a circuit configuration of a differential circuit to which the invention is applied. In a conventional differential circuit, a transistor TR21 which operates as a power supply and determines a bias of the circuit is disposed, and the source terminal of a transistor TR11 for a differential operation and the source terminal of a transistor TR12 are connected to the drain terminal of the transistor TR21. The drain terminal of the transistor TR11 is connected to a power supply on the high potential side (Vdd) via a load 1812 and the like, and the drain terminal of the transistor TR12 is also connected to the power supply on the high potential side (Vdd) via a load 1813 and the like.

On the other hand, the differential circuit to which the invention is applied includes switches 1801 to 1811 and capacitors 1812 and 1813 additionally.

When using a transistor as a switch, the conductivity of the transistor is not particularly limited as it operates simply as a switch. However, in the case where an off current is preferably small, a transistor having a conductivity of a smaller off current is preferably used, for example as switches connected to the capacitors 1812 and 1813. One of the transistors of a small off current is a transistor provided with an LDD region. It is preferable that an n-channel transistor be used in the case where a potential of the source terminal to operate as a switch is close to the power supply on the low potential side (Vss, Vgnd, 0V and the like), while a p-channel transistor is preferably used in the case where the potential of the source terminal thereof is close to the power supply on the high potential side (Vdd and the like). This is because an absolute value of the voltage between the gate and source can be large, which makes the operation as a switch easy. Note that a CMOS circuit may also be formed by using both n-channel and p-channel transistors.

A switch used in the invention may be any switch such as an electrical switch or a mechanical switch. That is, it may be anything as far as it can control a current. It may be a transistor, a diode, or a logic circuit configured with them.

The operation of the differential circuit in FIG. 1 is described with reference to FIGS. 2 to 6. First, a compensation operation is performed. At that time, the compensation operation may be performed to the transistors TR11 and TR12 at the same time. However, the transistor TR21 is the only transistor that operates as a power supply. It is considered that a compensation operation is performed with higher precision by using the same transistor. Therefore, the first compensation operation is performed by using the transistors TR11 and TR21, and then the second compensation operation is performed by using the transistors TR12 and TR21. Note that these compensation operations can be performed in reverse order.

Figure 2:
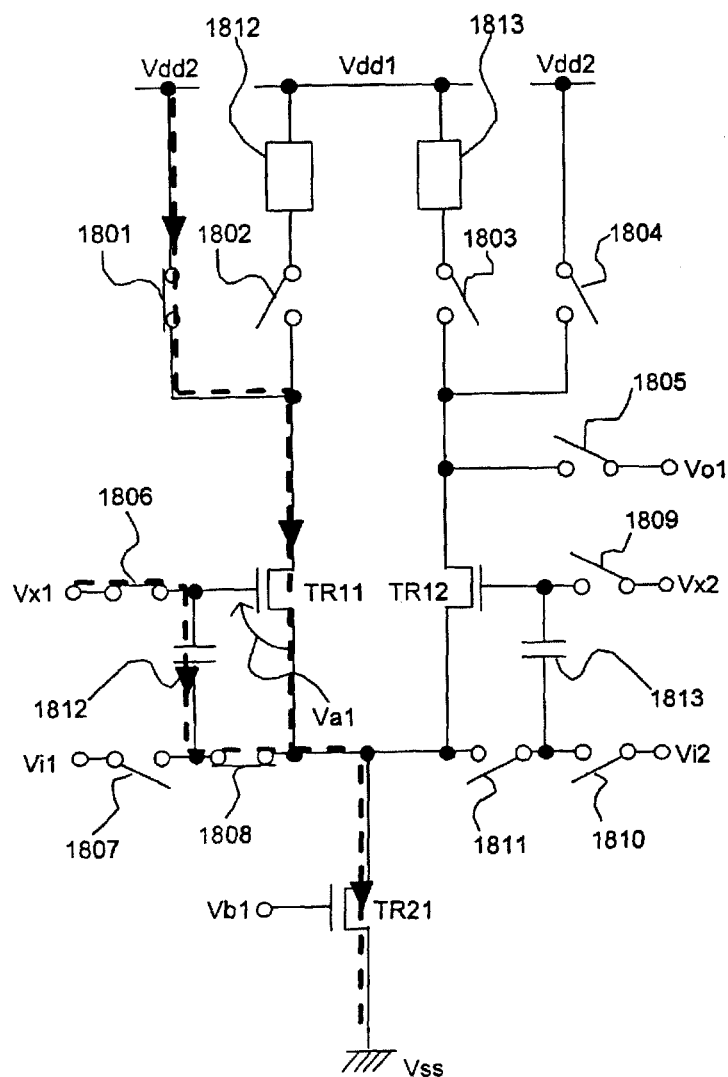
FIG. 2 is a diagram showing an operation of a differential circuit of the invention.

As shown in FIG. 2, a compensation operation is performed by using the transistors TR11 and TR21. At this time, current to be supplied to the transistor TR21 is controlled to flow to the transistor TR11 but not to the transistor TR12 because the current flowing to the transistor TR12 causes a possible error. Thus, current supplied to the transistor TR21 is controlled by using the switches 1801 to 1804 not to flow to the transistor TR12.

In FIG. 2, the switch 1801 is turned ON while the switches 1802 to 1804 are turned OFF. The switch 1801 is connected to a second power supply on the high potential side (Vdd2). However, the switch 1801 may be connected to a first power supply on the high potential side (Vdd1) connected to the load 1812 and the like. That is, a connection which allows current to flow to the transistor TR11 but not to the transistor TR12 is used. Therefore, the switches 1802 and 1803 may be arranged differently such that the switch 1802 is disposed between the source terminal of the transistor TR11 and the drain terminal of the transistor TR21. The loads 1812 and 1813 may have units for controlling current. Alternatively, current may be controlled by using the switch 1802 by removing the switch 1801 and the second power supply on the high potential side (Vdd2). In that case, the load 1812 is required to be capable of flowing current.

Figure 3:
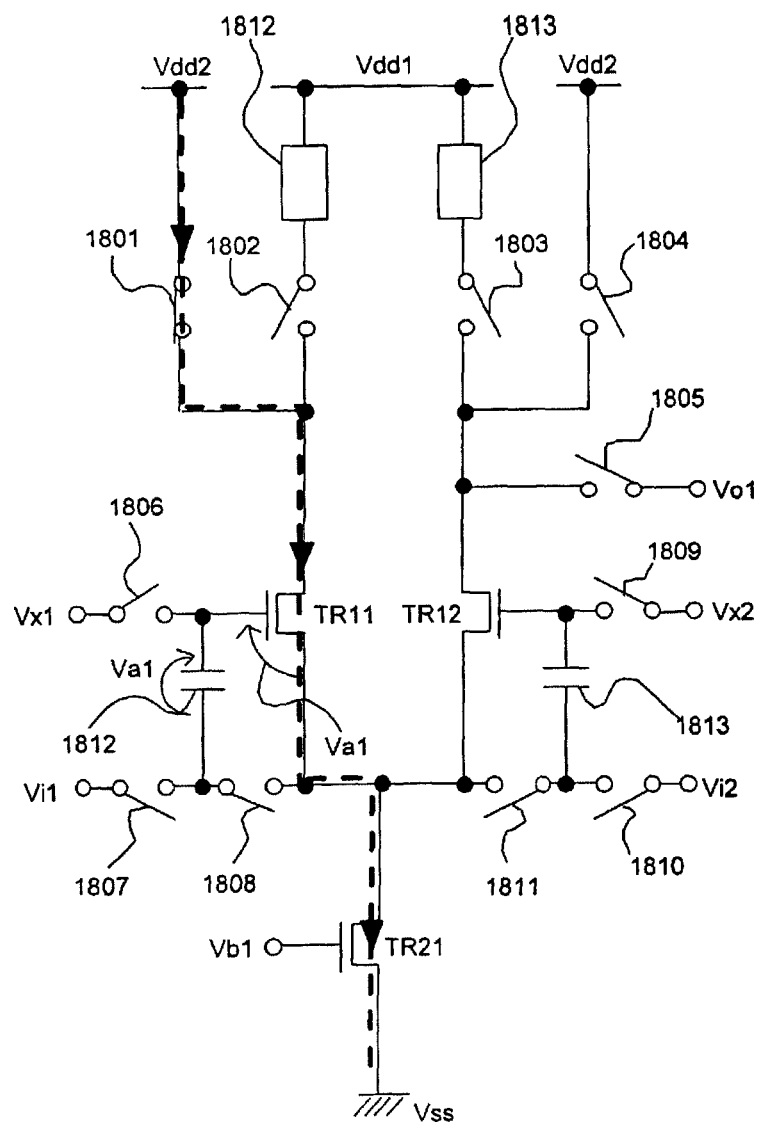
FIG. 3 is a diagram showing an operation of a differential circuit of the invention.

In this manner, a voltage Va1 between the gate and source of the transistor TR11 is stored in the capacitor 1812. By turning OFF the switch 1806, 1808 or the like as shown in FIG. 3, charge accumulated in the capacitor 1812 is held.

Figure 4:
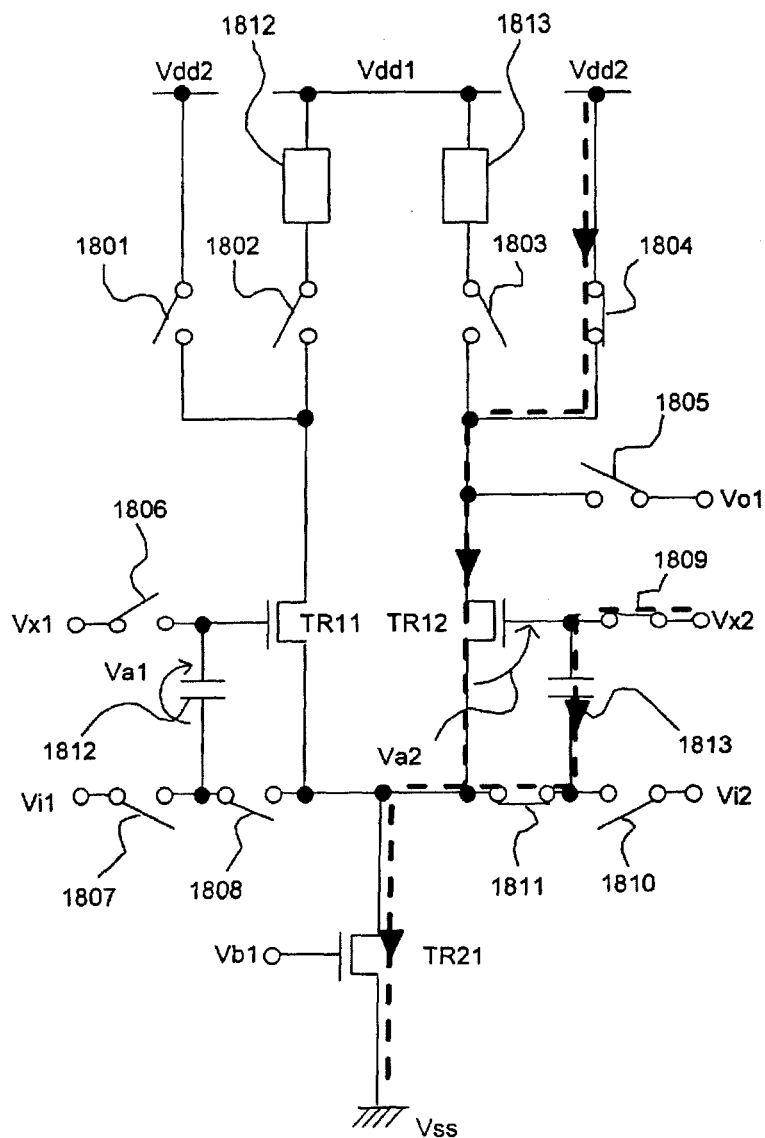
FIG. 4 is a diagram showing an operation of a differential circuit of the invention.
Figure 5:
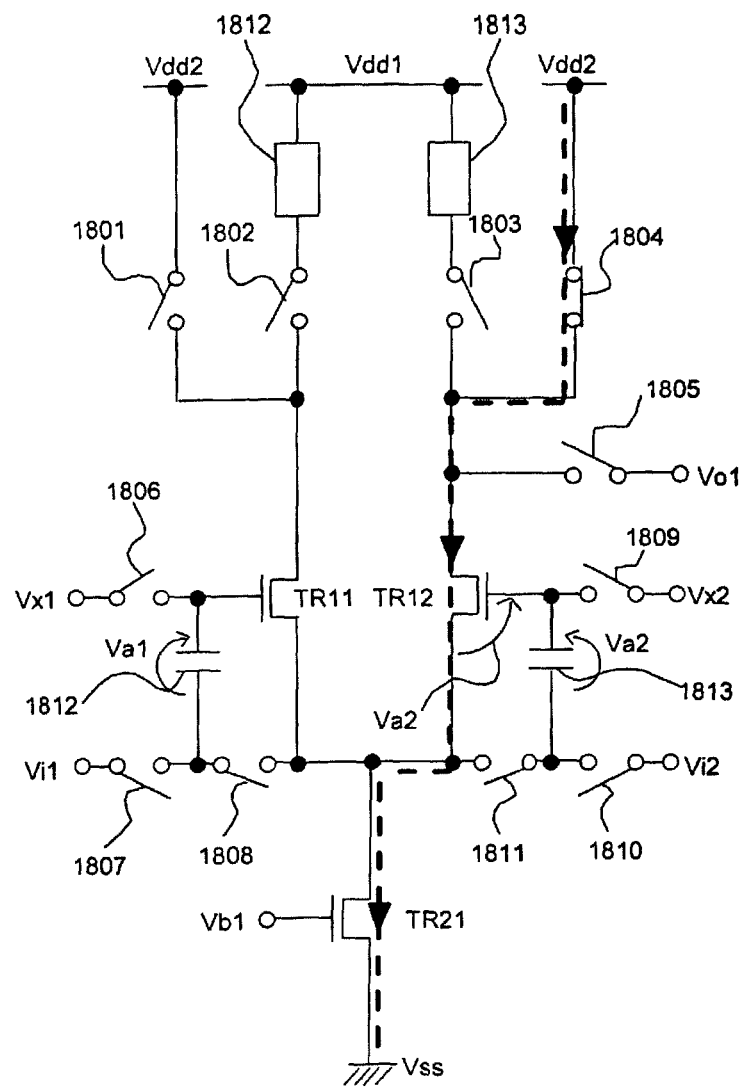
FIG. 5 is a diagram showing an operation of a differential circuit of the invention.

Next, a compensation operation is performed by using the transistors TR12 and TR21 as shown in FIGS. 4 and 5. Each switch is turned ON/OFF as shown in FIGS. 2 and 3. A voltage Va2 between the gate and source of the transistor TR12 is stored in the capacitor 1813. In this manner, the compensation operation terminates.

The compensation operation may be performed at least once before the normal operation is performed. That is, the normal operation can be performed as many times as needed as far as appropriate voltages are held in the capacitors 1812 and 1813. However, the charges stored in the capacitors 1812 and 1813 may eventually change due to a noise or a leak current. In that case, a compensation operation is performed once again before the charges stored in the capacitors 1812 and 1813 change drastically.

Figure 6:
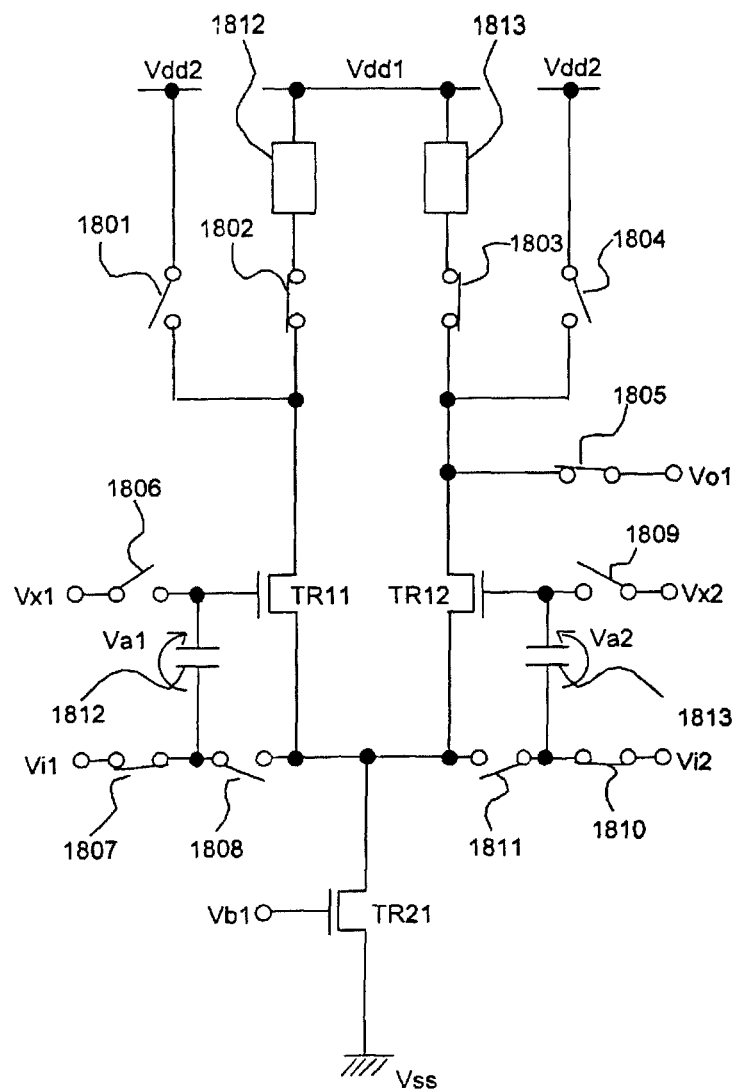
FIG. 6 is a diagram showing an operation of a differential circuit of the invention.

The normal operation is performed as shown in FIG. 6. That is to say, the switches 1801, 1804, 1806, 1808, 1809, and 1811 are turned OFF while the switches 1802, 1803, 1805, 1807, and 1810 are turned ON. In this manner, the voltages Va1 and Va2 between the gate and source of each transistor can be changed according to the variation of the characteristics of the transistors TR11 and TR12, which can decrease the effect of the variation. It should be noted in the normal operation that the voltage between the gate and source of each of the transistors TR11 and TR12 may change according to the current flowing to each transistor. In that case, the voltage between the gate and source may not be Va1 and Va2. However, a value reflecting the variation of the characteristics is applied to the gate terminal of the transistor, which decreases the effect of the variation.

In the case where the terminal for outputting an output voltage Vo1 has a high input impedance, the switch 1805 may be removed. The switch 1805 may not be required according to the arrangements of the loads 1812 and 1813.

By using such a differential circuit, a variety of circuits can be formed. By using a resistor or an active load circuit as the loads 1812 and 1813, for example, a differential amplifier circuit can be formed. Further, by disposing a diode-connected transistor (a transistor of which gate terminal and drain terminal are connected) as the loads 1812 and 1813, a part of an OTA (Operational Transconductance Amplifier) can be formed. By using these circuits in combination, it is possible to form such circuits as an operational amplifier, a sense amplifier, and a comparator.

An arrangement of the configuration of the differential amplifier circuit using an active load circuit as the loads 1812 and 1813 is described as an example.

First, a possible error is made small by performing the compensation operation and the normal operation with close operating points to each other.

Under the most typical operating condition of the differential amplifier circuit, input voltages Vi1 and Vi2 have the same potentials. In that case, half of the current flowing through the transistor TR21 is supplied to the transistor TR11 and the other half is supplied to the transistor TR12.

Figure 25:
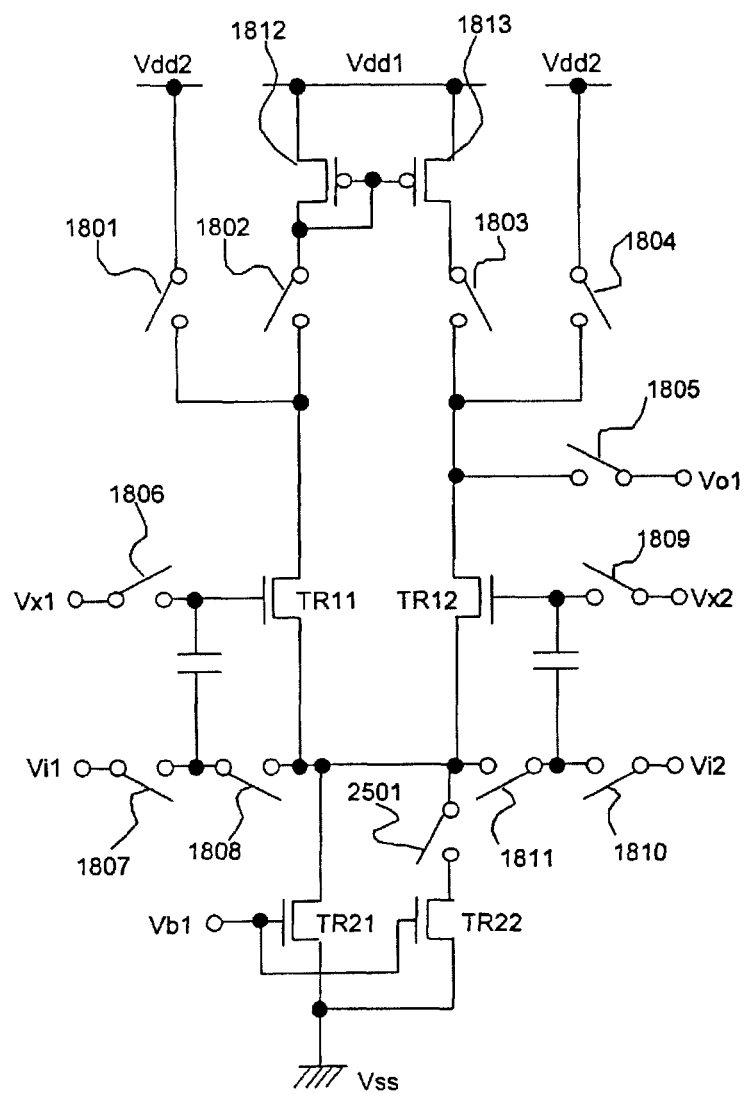
FIG. 25 is a diagram showing a configuration of a differential amplifier circuit of the invention.
Figure 26:
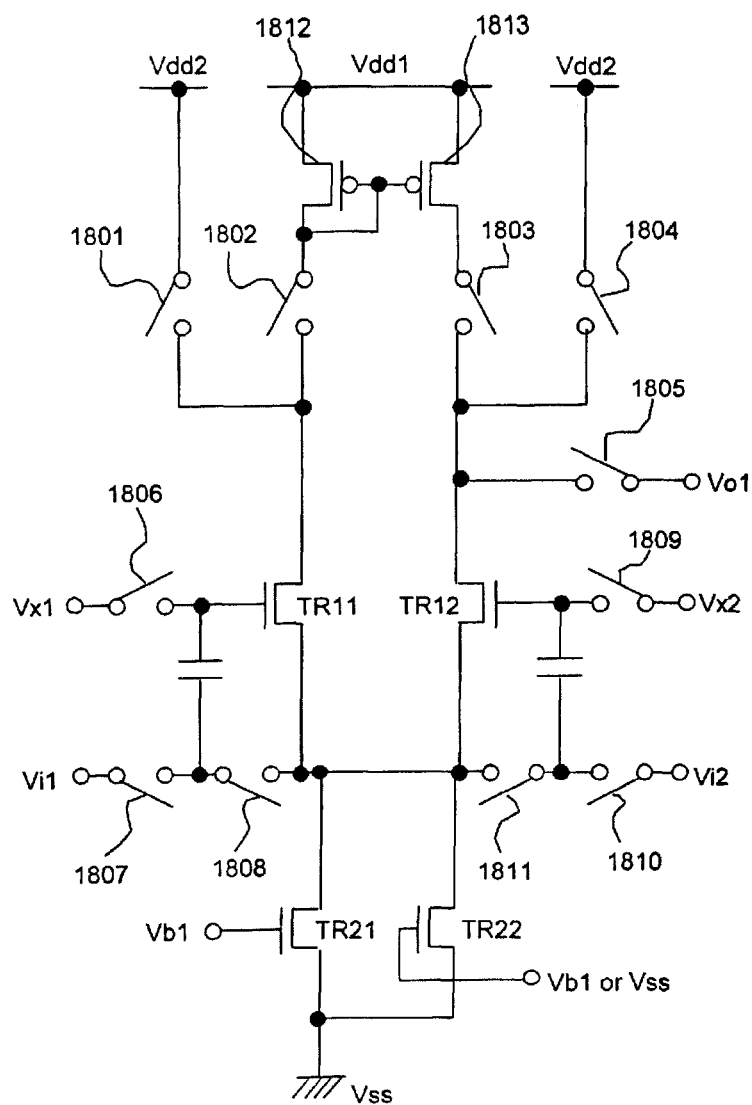
FIG. 26 is a diagram showing a configuration of a differential amplifier circuit of the invention.

On the other hand, it is preferable that operating conditions such as operating points are close in the compensation operation and the normal operation. In order to make the operating points close, current for the compensation operation may be half as much as that for the normal operation. FIGS. 25 and 26 show an example of that case.

In FIG. 25, a transistor TR22 is added as a transistor that operates as a power supply. It is preferable that the transistors TR21 and TR22 are the same in size. A bias voltage Vb is applied to the gate terminal of each transistor TR21 and TR22, and a switch 2501 is connected to the transistor TR22 in series. By turning ON/OFF the switch 2501, current in the compensation operation is made half as much as that in the normal operation. It should be noted that the switch 2501 may be disposed anywhere as long as it can control current.

In FIG. 26, a transistor TR22 is added as a transistor that operates as a power supply. It is preferable that the transistors TR21 and TR22 are the same in size. A bias voltage Vb is applied to the gate terminal of the transistor TR21, and the gate terminal of the transistor TR22 is applied different voltage in the compensation operation and the normal operation. Specifically, a power supply on the low potential side (Vss) is applied in the compensation operation so that the transistor TR22 is turned OFF. On the other hand, a bias voltage Vb is applied in the normal operation. Thus, current in the compensation operation can be half as much as that in the normal operation.

In this manner, by supplying different amount of current to a biasing transistor as described above, operating points can be close in the compensation operation and the normal operation. Error can be small when operating with close operating points.

Next, connections of the switches in the differential amplifier circuit using an active load circuit are changed.

Figure 27:
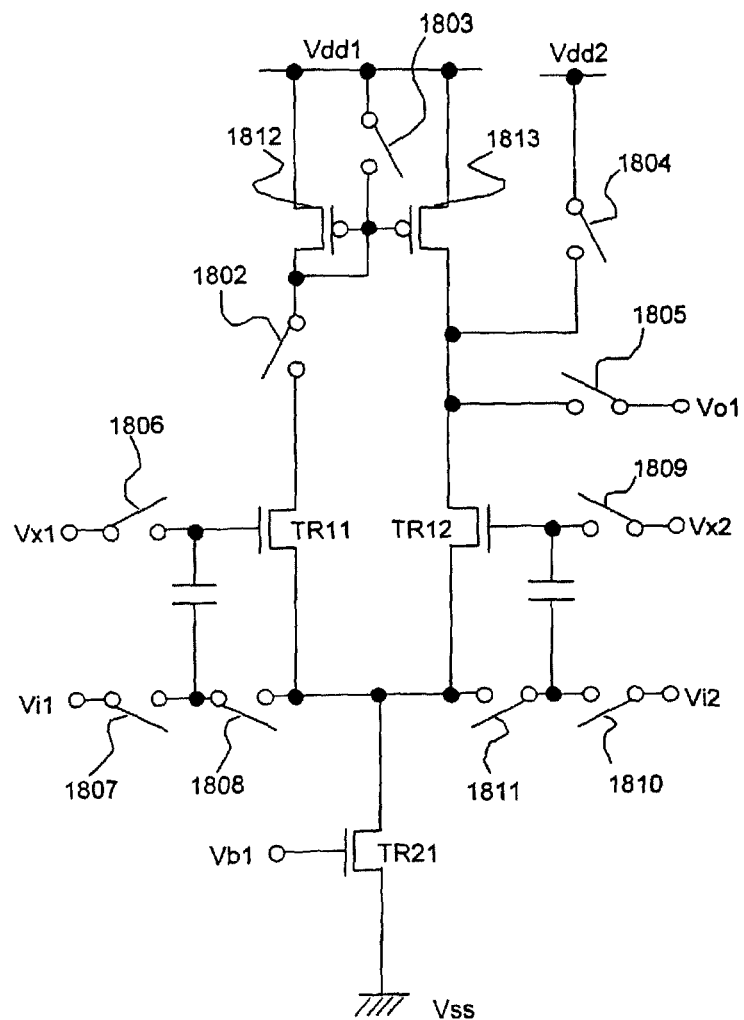
FIG. 27 is a diagram showing a configuration of a differential amplifier circuit of the invention.

It has already been mentioned above that the arrangement of the switches 1801 to 1804 in FIG. 2 can be changed. Now, the arrangement of the switches 1801 to 1804 is changed in the differential amplifier circuit using an active load circuit as the loads 1812 and 1813. FIG. 27 shows the case in which the switch 1801 is removed.

The operation of each switch is as follows. In the case of flowing current to the transistor TR11 and not to the transistor TR12, the switches 1802 and 1803 are turned ON while the switch 1804 is turned OFF. Then, the transistor 1813 is turned OFF because the voltage between the gate and source of the transistor 1813 becomes 0V. The transistor 1812 is also turned OFF, however, current flows via the switch 1803 and the switch 1802. In the case of flowing current to the transistor TR12 and not to the transistor TR11, the switch 1802 is turned OFF and the switch 1804 is turned ON, while the switch 1803 may be turned either ON or OFF. Then, current flows only to the transistor TR12. Last of all, in the case of flowing current to both transistors TR11 and TR12, that is in the normal operation, the switch 1802 is turned ON and the switches 1803 and 1804 are turned OFF.

Such arrangement of the switches as described above is viable. It should be noted that the connections are not limited to this.

In this manner, a variety of circuits can be formed by applying the invention to the differential circuit.

Figure 28:
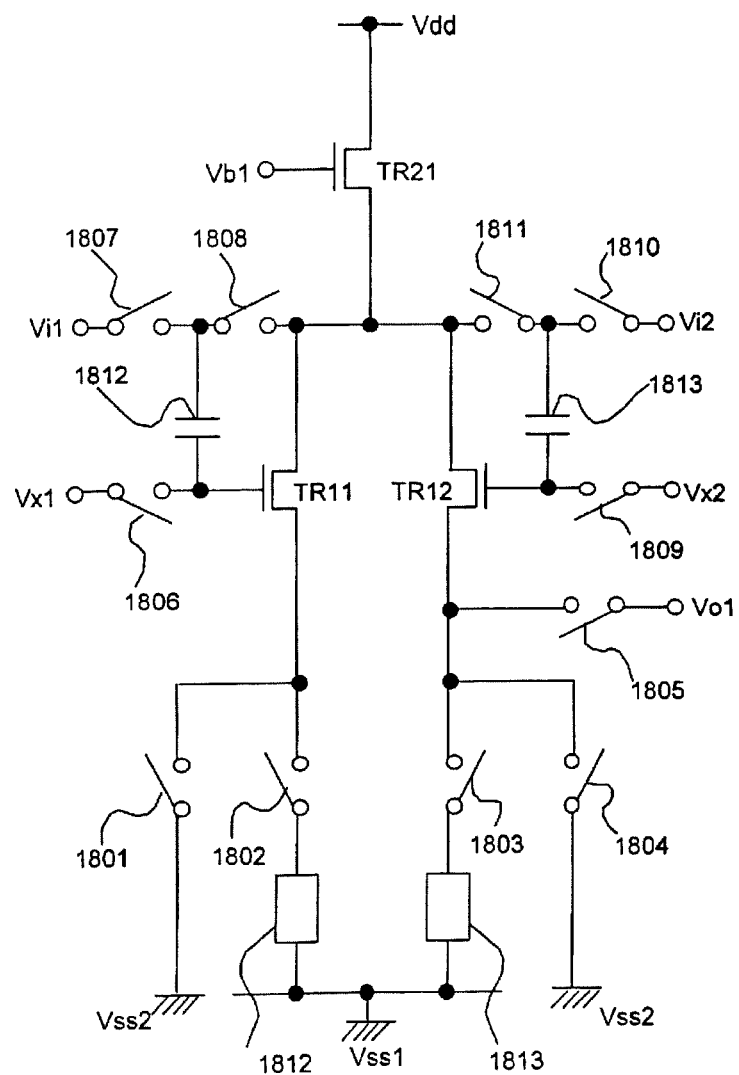
FIG. 28 is a diagram showing a configuration of a differential amplifier circuit of the invention.

The description so far has been made on the case where the transistors TR11 and TR12 are n-channel transistors. However, the invention can be applied in the case where these transistors are p-channel transistors. FIG. 28 shows the case where the circuit in FIG. 1 uses p-channel transistors as an example.

A reference voltage may be determined arbitrarily, therefore, a terminal which is applied the reference voltage may be connected to other wiring, node, or terminal. For example, terminals applied reference voltages Vx1 and Vx2 may be connected to terminals that are applied input voltages Vi1 and Vi2 or the drain terminals of the transistors.

Embodiment Mode 2

In this embodiment mode, a source follower circuit and the configuration and operation thereof are described as an example of the analog circuit of the invention. The configuration of the source follower circuit of the invention is described with reference to FIG. 18.

Figure 18:
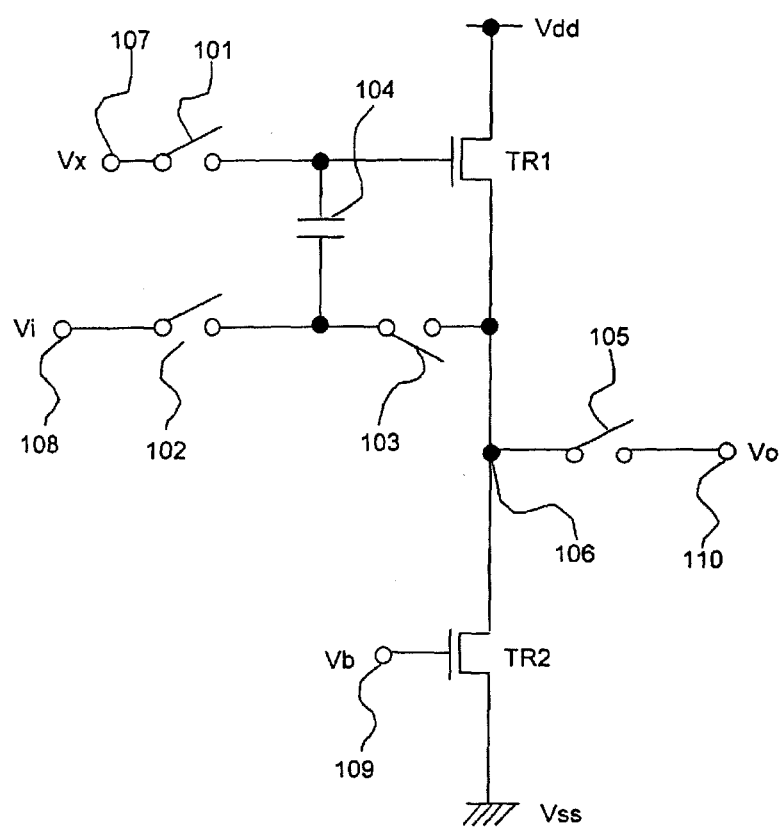
FIG. 18 is a diagram showing a configuration of a source follower circuit of the invention.

In FIG. 18, the transistor TR1 is an n-channel transistor that amplifies current. The transistor TR2 is an n-channel transistor that normally operates as a power supply and adjusts a bias voltage over the source follower circuit. The capacitor 104 holds a voltage between the gate and source of the transistor TR1. Further, denoted as 101 to 103 and 105 are switches, which are preferably semiconductor elements such as a transistor. By controlling the switches 101 to 103 and 105, the connections of the source follower circuit changes in the compensation operation and the normal operation.

In FIG. 18, the drain terminal of the transistor TR1 is connected to the power supply on the high potential side (Vdd). The source terminal of the transistor TR2 is connected to the power supply on the low potential side (Vss). It is assumed for simplicity that the potential of the power supply on the low potential side (Vss) is 0 V. A terminal 106 is the source terminal of the transistor TR1, which is connected to the drain terminal of the transistor TR2 and also connected to an output terminal 110 via the switch 105.

A terminal 107 is applied a reference voltage Vx and connected to the gate terminal of the transistor TR1 and one terminal of the capacitor 104 via the switch 101. An input terminal 108 is applied an input voltage Vi and connected to the other terminal of the capacitor 104 via the switch 102. The other terminal of the capacitor 104 is connected to the source terminal 106 of the transistor TR1 via the switch 103. A gate terminal 109 of the transistor TR2 is applied a bias voltage Vb.

The operation of the source follower circuit shown in FIG. 18 is described now.

The compensation operation is performed first. The switches 101 and 103 are turned ON to be conductive while the switch 105 is turned OFF to be non-conductive. The gate terminal 109 of the transistor TR2 is applied the bias voltage Vb, therefore, current flows through the transistor TR2. At this time, the terminal 106 is connected to the terminal 107 via the capacitor 104. The terminal 107 is applied the reference voltage Vx. Therefore, current flows between the terminals 107 and 106. When voltage at each end of the capacitor 104 becomes higher than the threshold voltage of the transistor TR1, the transistor TR1 turns ON, which allows current to flow between the source and drain thereof. When a value of current flowing between the source and drain of the transistor TR2 and a value of current flowing between the source and drain of the transistor TR1 become equal, current does not flow to the capacitor 104, which is a steady state.

At this time, a voltage required to flow the same amount of current to the transistor TR1 as that flowing through the transistor TR2, that is the voltage between the gate and source of the transistor TR1 is held in the capacitor 104. Therefore, when current characteristic or size of the transistor TR1 varies, the voltage between the gate and source of the transistor TR1 varies accordingly. It is assumed that the voltage between the gate and source of the transistor TR1 at this time is Va. Then, the potential of the terminal 106 is lower than the reference voltage Vx by Va.

Now that the circuit is in the steady state and current does not flow between the terminals 106 and 107, the switches 101 and 103 may be turned OFF without any problem. As a result, charge in the capacitor 104 is held and the voltage at each end of the capacitor 104 does not change following the law of conservation of electric charge.

In this manner, the compensation operation terminates. By this compensation operation, an appropriate voltage is stored in the capacitor 104.

When current does not keep flowing to the output terminal 110 in the compensation operation, that is when the input impedance of the output terminal 110 is high enough, the switch 105 can be removed to connect the terminal 106 and the output terminal 110 directly.

The compensation operation may be performed at least once before the normal operation is performed. That is, the normal operation can be performed as many times as needed as far as an appropriate voltage is held in the capacitor 104. However, the charge stored in the capacitor 104 may eventually change due to a noise or a leak current. In that case, a compensation operation is performed once again before the charge stored in the capacitor 104 changes drastically.

Next, the normal operation is performed. The switches 102 and 105 are turned ON and the switches 101 and 103 are turned OFF. The terminal 108 is applied an input voltage Vi. Therefore, the gate terminal of the transistor TR1 is applied a voltage in which a voltage Va of the capacitor 104 is added to the input voltage Vi. When the circuit is in a steady state, a value of current flowing between the source and drain of the transistor TR2 and a value of current flowing between the source and drain of the transistor TR1 become equal. The voltage between the gate and source of the transistor TR1 is Va.

Therefore, the potential of the terminal 106 is lower than the potential of the gate terminal of the transistor TR1 by the voltage Va between the gate and source of the transistor TR1. The potential of the gate terminal of the transistor TR1 is higher than the input voltage Vi by Va. As described above, the potential of the terminal 106 becomes equal to the input voltage Vi. That is, the output voltage Vo becomes equal to the input voltage Vi.

Therefore, the output voltage Vo is not dependent on the value of the reference voltage Vx. This means that the reference voltage Vx can have any potential. That is, the reference voltage Vx can have an arbitrary potential as long as the compensation operation is performed normally. It should be noted that the reference voltage Vx preferably has a potential which allows the transistors TR1 and TR2 to operate in a saturation region. This is because the transistors in the source follower circuit typically operate in a saturation region.

As the reference voltage Vx can have an arbitrary potential, the terminal 107 may be connected to other wiring, node, or terminal. For example, the terminal 107 may be connected to the input terminal 108. At this time, since the reference voltage Vx can have an arbitrary potential, the input voltage Vi in the compensation operation can have an arbitrary potential as well. Therefore, the input voltage Vi may have different potentials in the compensation operation and the normal operation.

Similarly, the terminal 107 may be connected to any of the power supply on the high potential side (Vdd), the drain terminal of the transistor TR1, the output terminal 110, or the terminal 109. In this manner, the terminal 107 can be connected arbitrarily.

As well as being not dependent on the reference voltage Vx, the output voltage Vo is not dependent on the voltage Va between the gate and source of the transistor TR1. This means that the voltage Va between the gate and source of the transistor TR1 can have an arbitrary potential. That is, the output voltage Vo is not affected when the current characteristics (mobility, threshold voltage and the like) or the size (gate length L and gate width W) of the transistor TR1 vary.

The output voltage Vo is not dependent on the current flowing between the source and drain of the transistor TR1 or TR2. That is to say, the output voltage Vo is not dependent on the bias voltage Vb that is applied to the gate terminal 109 of the transistor TR2. Further, the output voltage Vo is not also dependent on the current characteristics (mobility, threshold voltage and the like) or the size (gate length L and gate width W) of the transistor TR2.

In this manner, the gate terminal of the transistor TR1 in the normal operation is not applied the input voltage Vi as it is, but the voltage in which the voltage stored in the capacitor 104 is added to the input voltage Vi. The voltage stored in the capacitor 104 has a potential corresponding to the state of the condition. That is, the voltage stored in the capacitor 104 changes according to the variation of the current characteristics and sizes of the transistors TR1 and TR2. Accordingly, an effect of variation of the transistors TR1 and TR2 can be decreased.

Figure 13:
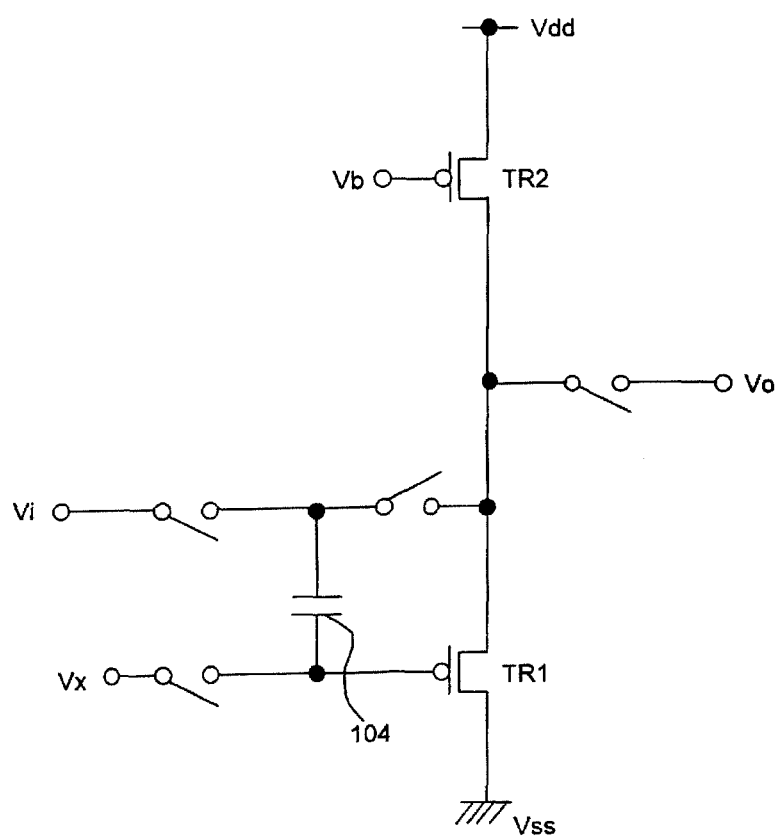
FIG. 13 is a diagram showing a configuration of a source follower circuit of the invention.

FIG. 18 shows the case where the transistors TR1 and TR2 are n-channel transistors. However, the invention can be applied in the case where these transistors are p-channel transistors. FIG. 13 shows the source follower circuit using p-channel transistors as the transistors TR1 and TR2. The transistor TR1 amplifies current. The transistor TR2 normally operates as a power supply and adjusts a bias voltage over the source follower circuit. Denoted as 104 is a capacitor which holds a voltage between the gate and source of the transistor TR1. It should be noted that the detailed description of the operation and configuration are omitted here since they are the same in the case of using n-channel transistors.

In FIGS. 18 and 13, the transistor TR2 that operates as a power supply and adjusts a bias voltage over the source follower circuit is disposed. However, the transistor TR2 may not necessarily be disposed. This corresponds to the case where the transistor TR2 has a current value of zero.

Figure 7:
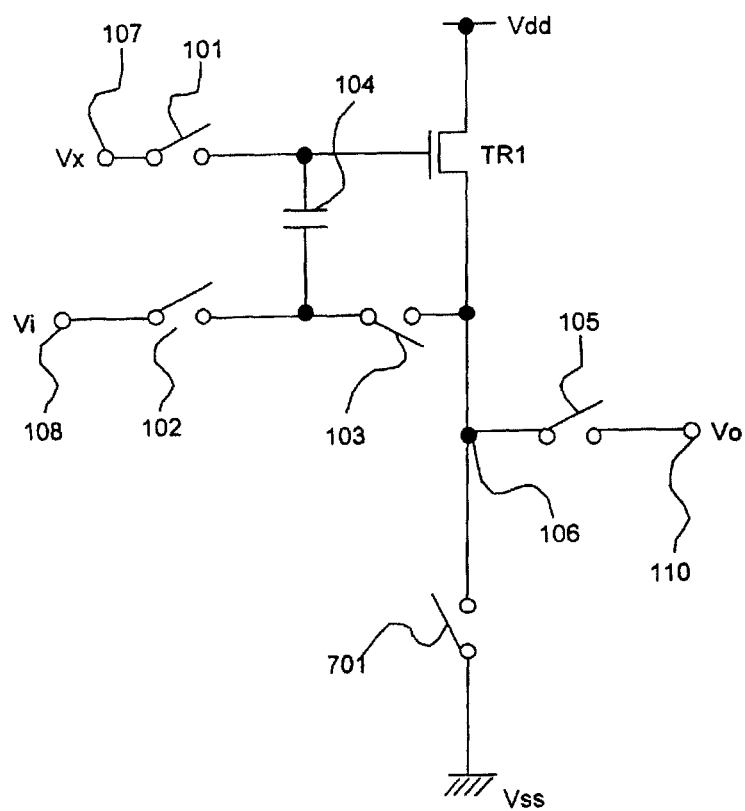
FIG. 7 is a diagram showing a configuration of a source follower circuit of the invention.

FIG. 7 shows a circuit diagram of the source follower circuit without the transistor TR2 shown in FIG. 18. A switch 701 is connected between the terminal 106 and the power supply on the low potential side (Vss). The switch 701 can turn ON the transistor TR1 in the compensation operation. Therefore, the switch 701 may be disposed at other place as long as it can turn ON the transistor TR1 in the compensation operation. Otherwise, the switch 701 may not be provided.

Next, the operation of the source follower circuit without the transistor TR2 shown in FIG. 7 is described.

The compensation operation is performed first. The compensation operation can be divided into two stages. In the first stage, the transistor TR1 is turned ON. Thereafter in the second stage, the voltage between the gate and source of the transistor TR1 and the threshold voltage of the transistor TR1 are made almost equal.

In the circuit shown in FIG. 18, the compensation operation does not have to be divided into two stages, however, connection of the circuit and the like are required to be changed according to each stage of the compensation operation in the circuit in FIG. 7.

In the first stage of the compensation operation, the transistor TR1 is turned ON by turning ON the switches 101, 103, and 701 and turning OFF the switches 102 and 105. Therefore, the voltage between the gate and source of the transistor TR1 at this time is higher than the threshold voltage of the transistor TR1.

The operation method in the first stage is not limited to the aforementioned method as long as the transistor TR1 can be turned ON. For example, the switch 701 is removed so that the terminal 106 and the power supply on the low potential side (Vss) are not connected. The switch 102 is turned ON and the reference voltage Vx and the input voltage Vi are controlled to turn ON the transistor TR1.

Next, in the second stage of the compensation operation, the switches 101 and 103 are turned ON and the switches 102, 105 and 701 are turned OFF. Thus, the source terminal of the transistor TR1 is connected only to the capacitor 104. Then, current flows between the source and drain of the transistor TR1 when turned ON. The current flows into the capacitor 104, and the charge stored in the capacitor 104 is released as a result. The charge keeps being released until the transistor TR1 is turned OFF, that is when the voltage between the gate and source of the transistor TR1 becomes equal to the threshold voltage of the transistor TR1. When the voltage between the gate and source of the transistor TR1 becomes equal to the threshold voltage of the transistor TR1, current hardly flows to the transistor TR1 and the capacitor 104.

Now that current hardly flows in the circuit, the switches 101 and 103 can be turned OFF without any problem since no current flows between the terminals 106 and 107. As a result, the charge in the capacitor 104 is held and the potential at each end of the capacitor 104 does not change following the law of conservation of electric charge.

In this manner, the compensation operation terminates. By this compensation operation, the threshold voltage of the transistor TR1 is held in the capacitor 104.

The compensation operation is not necessarily performed until the voltage of the capacitor 104 and the threshold voltage of the transistor TR1 become equal. It may be performed until the voltage of the capacitor 104 and the threshold voltage of the transistor TR1 become almost equal.

Subsequently, the normal operation is performed. The switches 102 and 105 are turned ON and the switches 101, 103, and 701 are turned OFF. The terminal 108 is applied an input voltage Vi. Therefore, the gate terminal of the transistor TR1 is applied a voltage in which the voltage of the capacitor 104, that is the threshold voltage of the transistor TR1 is added to the input voltage Vi. When the steady state is obtained, current hardly flows between the source and drain of the transistor TR1. The voltage between the gate and source of the transistor TR1 at that time is almost equal to the threshold voltage of the transistor TR1.

Therefore, the potential of the terminal 106 is lower than the potential of the gate terminal of the transistor TR1 by the threshold voltage of the transistor TR1. The potential of the gate terminal of the transistor TR1 is higher than the input voltage Vi by the voltage of the capacitor 104, that is the threshold voltage of the transistor TR1. As described above, the potential of the terminal 106 is equal to the input voltage Vi. That is, the output voltage Vo becomes equal to the input voltage Vi.

Figure 15:
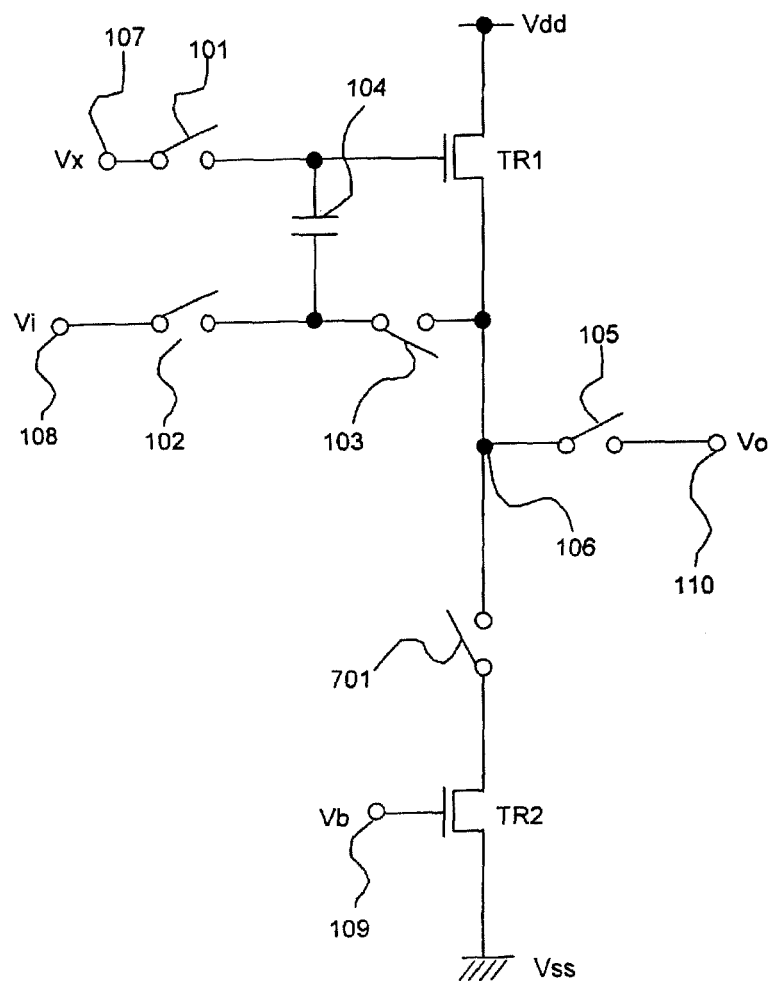
FIG. 15 is a diagram showing a configuration of a source follower circuit of the invention.

The transistor TR2 that operates as a power supply is not provided in FIG. 7, however, it may be provided as well. The circuit diagram including the transistor TR2 is shown in FIG. 15. The operation thereof is the same as in FIG. 7 in respect of the compensation operation in which the threshold voltage is held in the capacitor 104. In the normal operation, however, the switch 701 is required to be turned ON since the transistor TR2 has to operate as a power supply.

Note that a capacitor may be connected to the transistor TR2 to store the threshold voltage thereof to compensate for variation of the transistor TR2.

In this manner, the invention can be similarly applied to the circuit without the transistor TR2. Therefore, it is also the same in the circuit without the transistor TR2 that the reference voltage Vx has an arbitrary value and variation of the current characteristics (mobility, threshold voltage and the like) or the size (gate length L and gate width W) of the transistor TR1 does not affect. The transistor TR1 is an n-channel transistor in FIG. 7, however, it may be a p-channel transistor as well.

Figure 14:
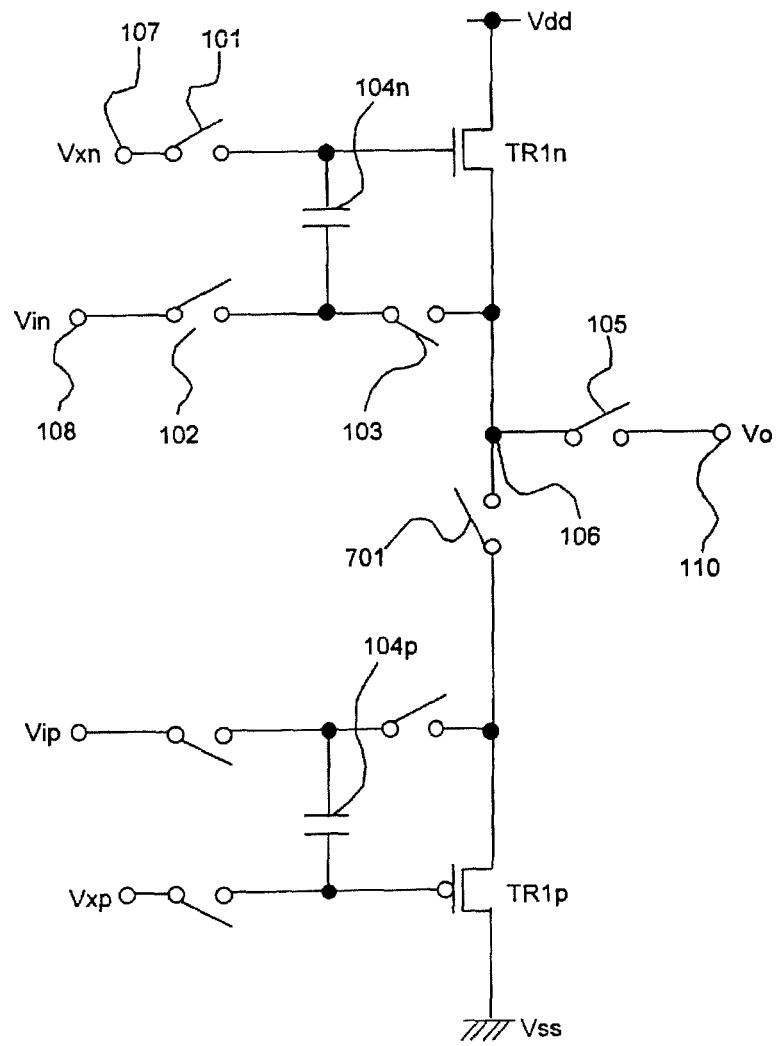
FIG. 14 is a diagram showing a configuration of a source follower circuit of the invention.

By using both an n-channel transistor TR1 and a p-channel transistor TR1 as amplifier transistors in combination, a push-pull amplifier may be formed as well. The circuit diagram in that case is shown in FIG. 14. The p-channel transistor TR1$p$ is connected to the power supply on the low potential side (Vss) and a capacitor 104$p$ is connected between the gate and source thereof. The n-channel transistor TR1$n$ is connected to the power supply on the high potential side (Vdd) and the capacitor 104$n$ is connected between the gate and source thereof. The operation and the like thereof are omitted here since it is similar to the case of FIG. 7.

The capacitor may store the threshold voltage of the transistor instead of the voltage between the gate and source of the transistor in the differential circuit as well as in the source follower circuit as shown in FIG. 15. For example, when applying the aforementioned idea to the circuit in FIG. 1, it is required that a switch is disposed between the source terminal of the transistor TR11 and the drain terminal of the transistor TR21, and between the source terminal of the transistor TR12 and the drain terminal of the transistor TR21.

Figure 21:
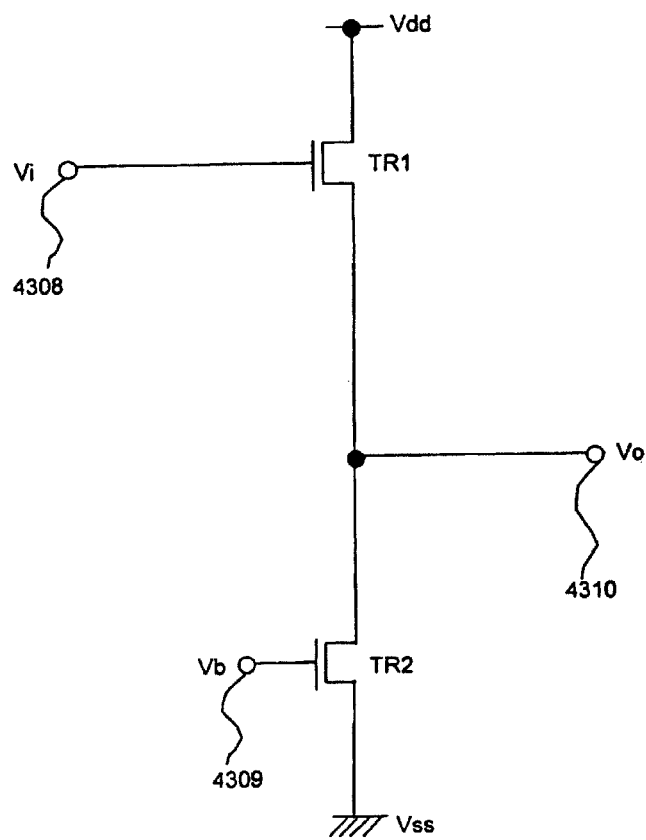
FIG. 21 is a diagram showing a configuration of the conventional source follower circuit.

Described in this embodiment mode is the case of applying the invention to the source follower circuit, however, it can also be applied to a cascode circuit which is quite similar to the source follower circuit in configuration. The cascode circuit is different from the source follower circuit in the following respect. Taking FIG. 21 as an example, the gate terminal 4309 of the transistor TR2 is an input terminal, the gate terminal 4308 of the transistor TR1 is a terminal for applying a bias voltage, such a load as a resistor is disposed between the drain terminal of the transistor TR1 and the power supply on the high potential side (Vdd), and a node of the load and the drain terminal of the transistor TR1 is an output terminal.

Figure 16:
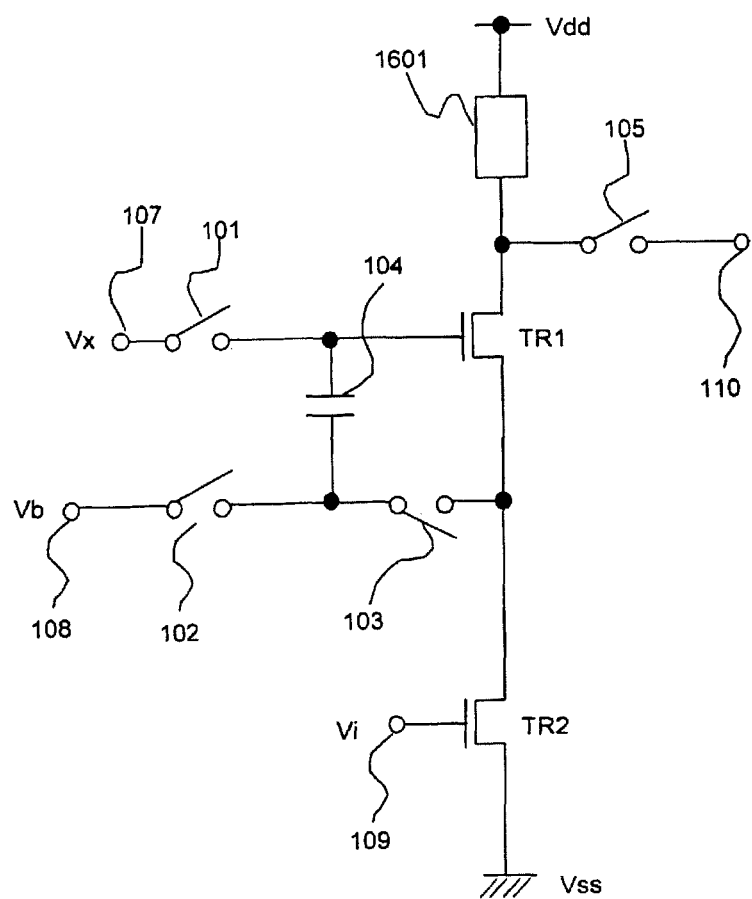
FIG. 16 is a diagram showing a configuration of a cascode circuit of the invention.

FIG. 16 shows a circuit diagram of the cascode circuit to which the invention is applied. A load 1601 is disposed between the drain terminal of the transistor TR1 and the power supply on the high potential side (Vdd). It should be noted that the transistors TR1 and TR2 are n-channel transistors in FIG. 16, however, it is needless to say that they may be p-channel transistors as well. The operation and the like of the aforementioned cascode circuit are similar to the source follower circuit, therefore, the description is omitted here.

Figure 17:
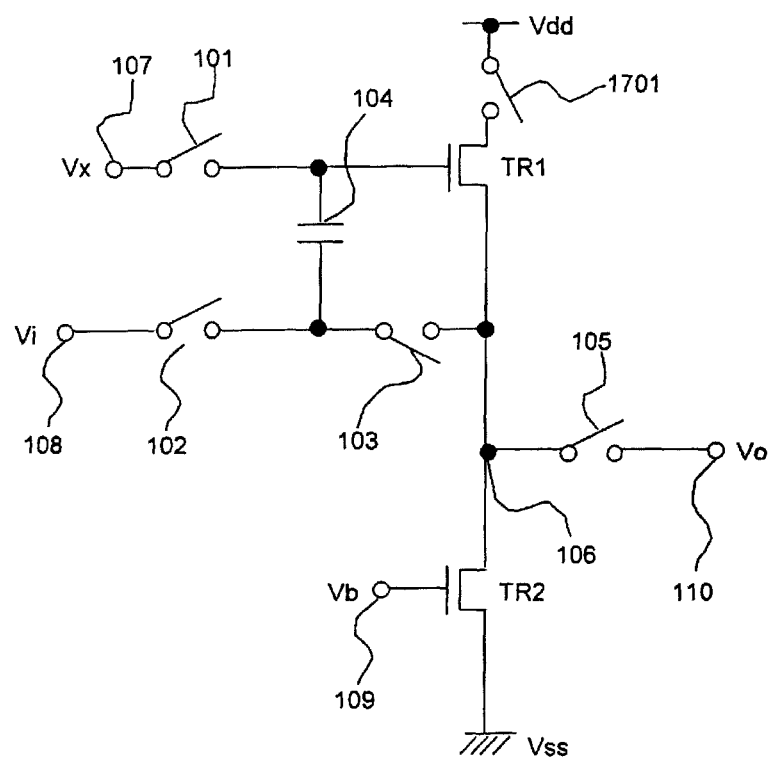
FIG. 17 is a diagram showing a configuration of a source follower circuit of the invention.

Finally, a method for decreasing power consumption of the circuit is described. In the analog circuit, current often keeps flowing even in the steady state. In the source follower circuit, for example, current normally keeps flowing from the transistor TR1 to the transistor TR2 even in the steady state, which consumes much power. Therefore, it is possible to decrease power consumption by interrupting the current flowing in the steady state. FIG. 17 shows a circuit based on FIG. 18 that is arranged to decrease power consumption. In the circuit in FIG. 17, a switch 1701 is disposed between the power supply on the high potential side (Vdd) and the drain terminal of the transistor TR1. By controlling the switch 1701, current flowing from the transistor TR1 to the transistor TR2 in the steady state can be interrupted. Note that the switch 1701 may be disposed anywhere as long as it can interrupt the flowing current. Further, the flowing current may be interrupted without providing the switch 1701. For example, the voltage Vb of the gate terminal 109 of the transistor TR2 may be controlled so as not to flow current to the transistor TR2. Similarly, the potential of the gate terminal of the transistor TR1 may be controlled so as not to flow current.

It should be noted that the aforementioned idea that current which keeps flowing in the steady state is interrupted in order to decrease power consumption may be applied to a differential circuit as well.

The description in Embodiment Mode 1 can be applied to this embodiment mode, and the description made in this embodiment mode can be applied to Embodiment Mode 1 as well.

Embodiment Mode 3

In the aforementioned Embodiment Modes 1 and 2, the source follower circuit and the differential circuit to which the invention is applied have been described. By using these circuits in combination, it can be applied to a variety of circuits. In this embodiment mode, an operational amplifier to which the invention is applied is described as an example.

It should be noted that the operational amplifier has various circuit configurations. Therefore, the circuit configuration of the operational amplifier is not limited to this embodiment mode. The invention can be applied to operational amplifiers of various configurations.

Figure 29:
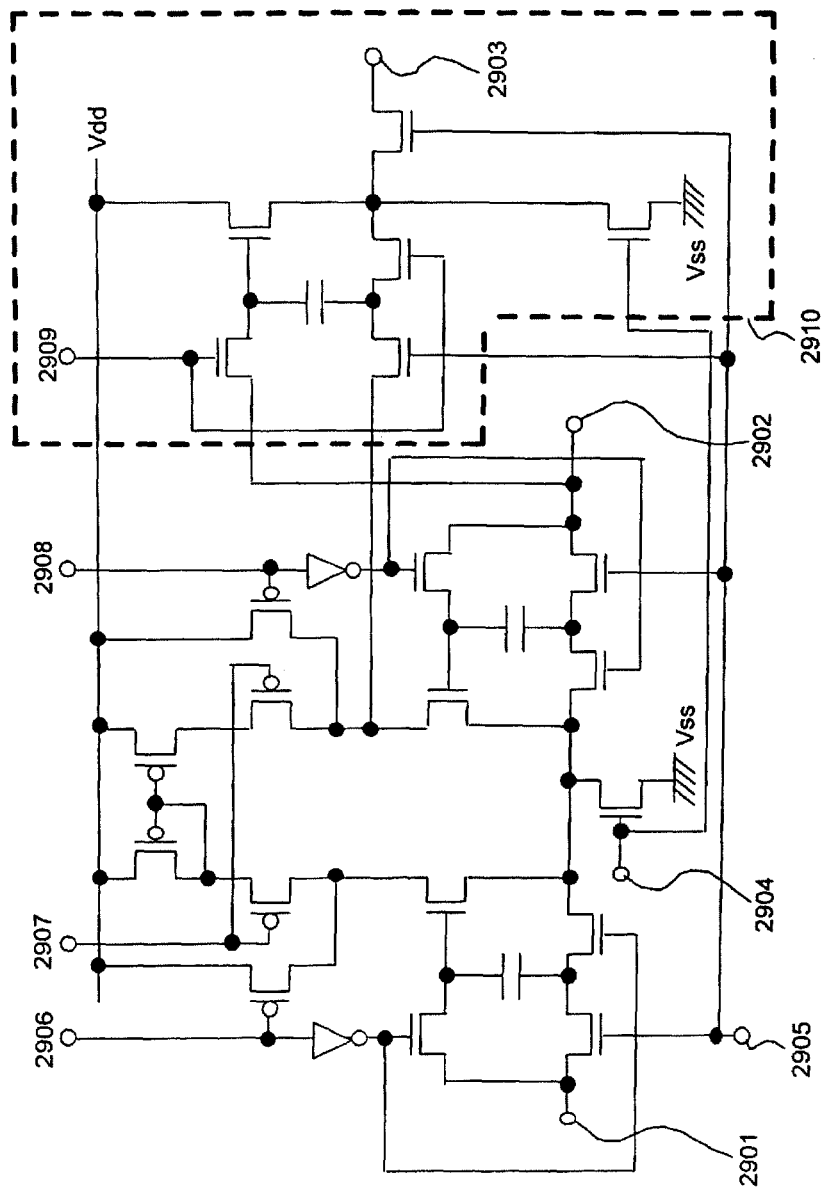
FIG. 29 is a diagram showing a configuration example of an operational amplifier of the invention.

As the simplest configuration of the operational amplifier, a differential amplifier circuit is used in combination with a source follower circuit. As shown in FIG. 29, the circuit in FIG. 1 is used as the differential circuit, an active circuit is used as a load of the differential circuit, and the circuit in FIG. 18 is used as the source follower circuit. A region 2901 surrounded by a dotted line corresponds to the source follower circuit. Signals are inputted from a positive input terminal 2901 and a negative input terminal 2902 and outputted from an output terminal 2903. By controlling the voltage to apply to a bias terminal 2904, current to flow as a bias is controlled. The compensation operation and the normal operation of each portion are switched by controlling a timing to input signals to terminals 2905 to 2909. It should be noted that by changing connection to the terminals 2905 to 2909 and the like, the compensation operation can be performed simultaneously in a plurality of portions in the circuit.

Figure 30:
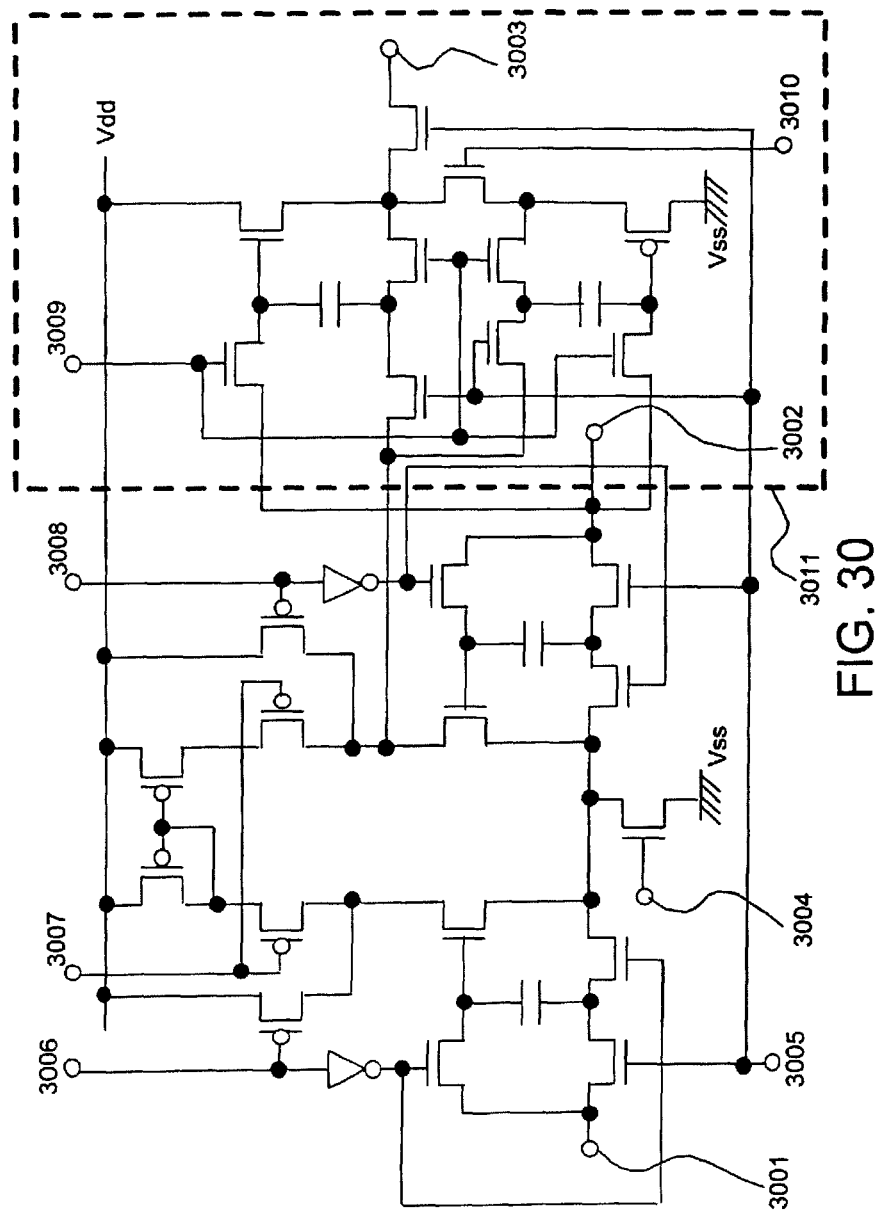
FIG. 30 is a diagram showing a configuration example of an operational amplifier of the invention.

An operational amplifier including a push-pull buffer in the output stage is shown in FIG. 30. The circuit in FIG. 14 is used as a push-pull source follower circuit. A region 3011 surrounded by a dotted line corresponds to the push-pull source follower circuit. In FIG. 30, signals are inputted from a positive input terminal 3001 and a negative input terminal 3002 and outputted from an output terminal 3003. By controlling the voltage to apply to a bias terminal 3004, current to flow as a bias is controlled. The compensation operation and the normal operation of each portion are switched by controlling a timing to input signals to terminals 3005 to 3010. It should be noted that by changing connection to the terminals 3005 to 3010 and the like, the compensation operation can be performed simultaneously in a plurality of portions in the circuit.

Figure 31:
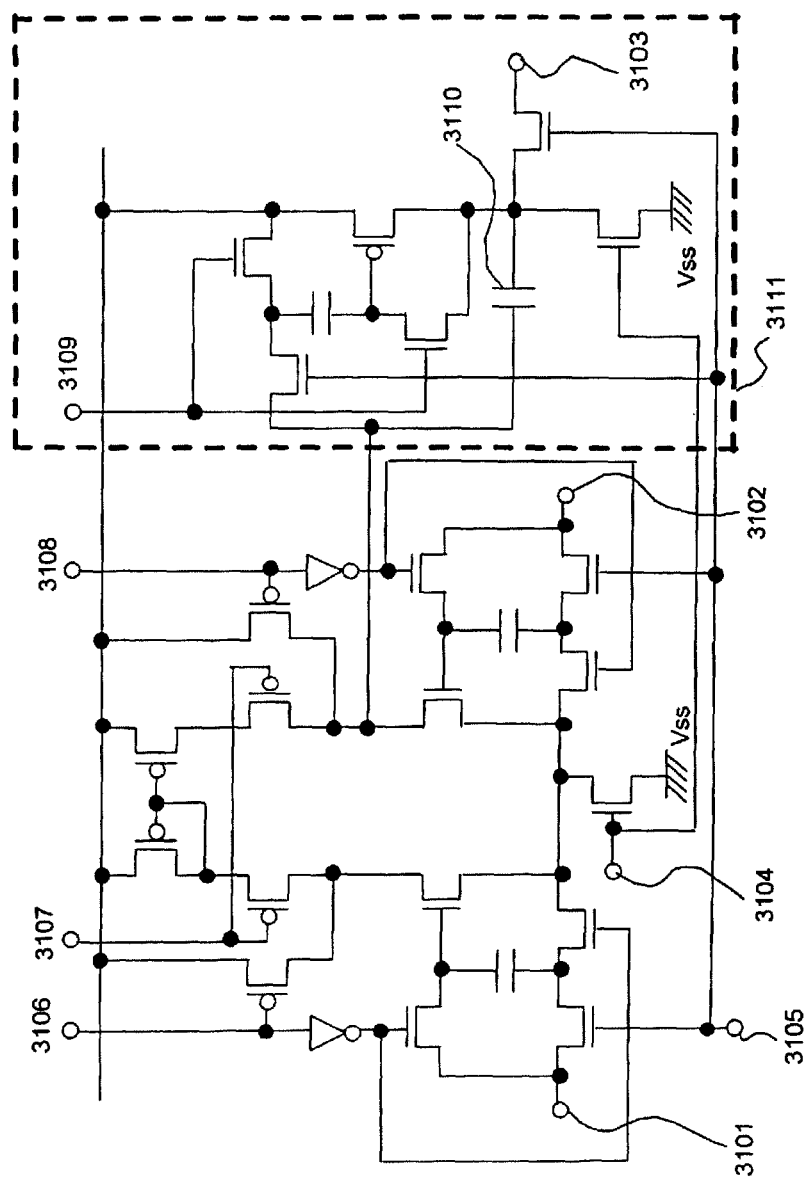
FIG. 31 is a diagram showing a configuration example of an operational amplifier of the invention.

Subsequently, an operational amplifier having two amplification stages is shown in FIG. 31. A common source amplifier circuit is used as a second amplification stage. A region 3111 surrounded by a dotted line corresponds to the common source amplifier circuit. In FIG. 31, signals are inputted from a positive input terminal 3101 and a negative input terminal 3102, and outputted from an output terminal 3103. Current to be supplied as a bias is controlled by controlling a voltage to apply to a bias terminal 3104. By controlling a timing to input a signal to terminals 3105 to 3109, the compensation operation and the normal operation of each portion are switched. Note that compensation operation can be performed in a plurality of circuit portions at the same time by changing the connection to the terminals 3105 to 3109 and the like.

A capacitor 3110 is provided for phase compensation. It may be disposed at other place or a resistor may be disposed in series. An additional source follower circuit may be disposed next to the second amplification stage.

Figure 32:
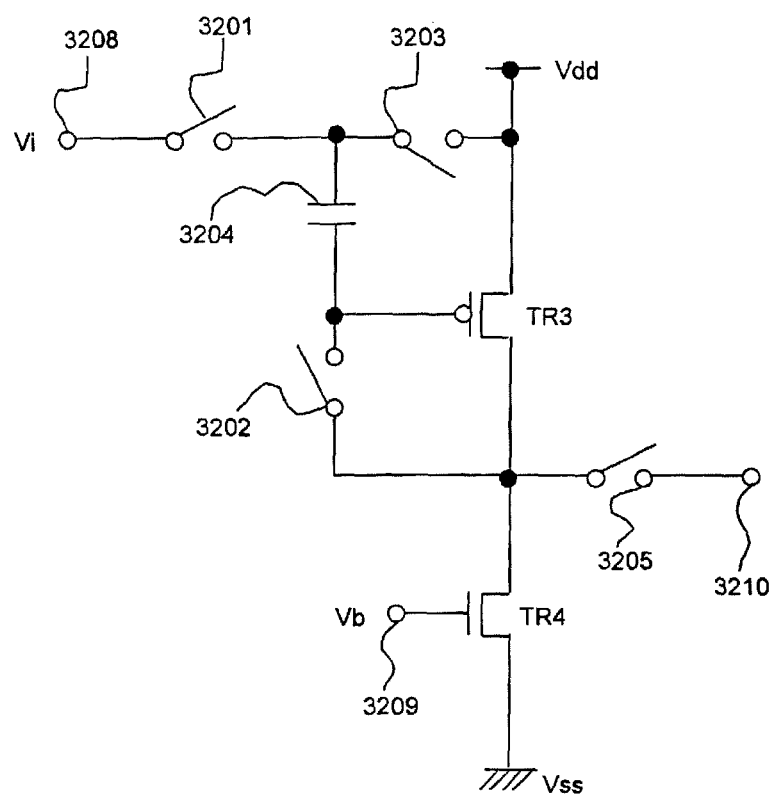
FIG. 32 is a diagram showing a configuration of a common source amplifier circuit of the invention.

Here, a common source amplifier circuit is briefly described. FIG. 32 shows a common source amplifier circuit to which the invention is applied.

It should be noted that in a conventional common source amplifier circuit, the drain terminal of a transistor TR4 for supplying a bias current and the drain terminal of an amplifier transistor TR3 are connected and the node thereof is an output terminal. The source terminals of the transistors TR3 and TR4 are grounded, therefore, polarities of both transistors are opposite. The gate terminal of the transistor TR4 is applied a bias voltage and the gate terminal of the transistor TR3 is applied an input voltage.

On the other hand, switches 3201 to 3203 and 3205 and a capacitor 3204 are added in the common source amplifier circuit in FIG. 32. In the case where an output terminal 3210 has a high input impedance, the switch 3205 may be removed to connect the drain terminal of the transistor TR3 and the output terminal 3210.

Figure 33:
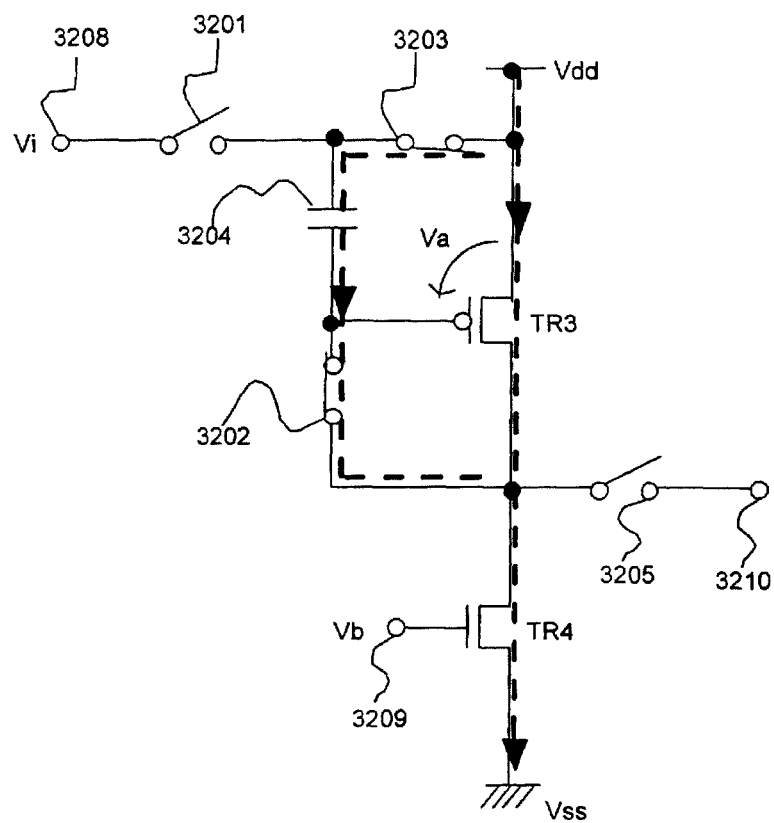
FIG. 33 is a diagram showing an operation of a common source amplifier circuit of the invention.
Figure 34:
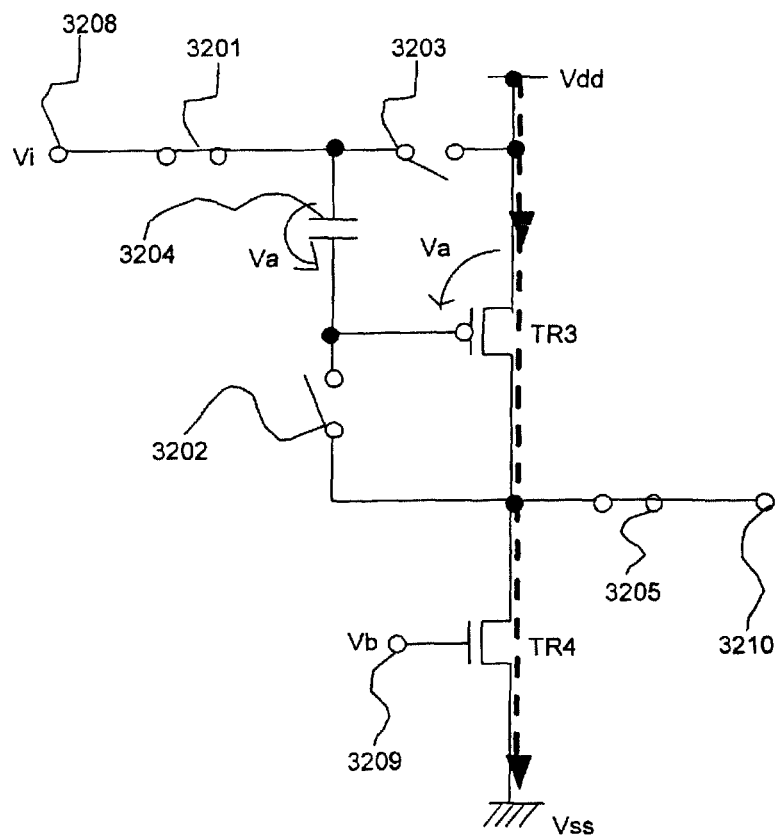
FIG. 34 is a diagram showing an operation of a common source amplifier circuit of the invention.

Subsequently, the operation of the common source amplifier circuit in FIG. 32 is described with reference to FIGS. 33 and 34. First, the compensation operation is performed. As shown in FIG. 33, the switches 3203 and 3202 are turned ON and the switches 3201 and 3205 are turned OFF. Then, the voltage Va between the gate and source of the transistor TR3 is stored in the capacitor 3204.

Thereafter, the normal operation is performed. As shown in FIG. 34, the switches 3201 and 3205 are turned ON and the switches 3202 and 3203 are turned OFF. Then, an input voltage Vi is applied to an input terminal 3208. Then, the voltage in which the voltage Va stored in the capacitor 3204 is added to the input voltage Vi is applied to the gate terminal of the transistor TR3. The voltage Va stored in the capacitor 3204 has a potential corresponding to the current characteristics of the transistor TR3. Therefore, effect of variation of the transistor TR3 can be decreased.

It should be noted that the compensation operation may be performed at least once as in the source follower circuit.

The threshold voltage of the transistor may be stored in the capacitor 3204 instead as in FIG. 7 and the like.

Figure 35:
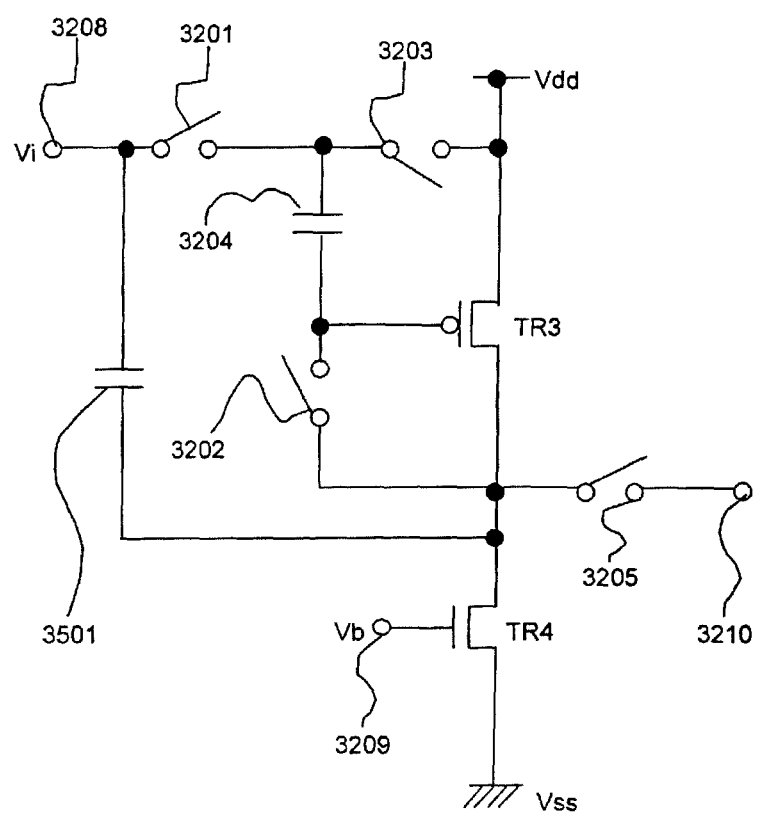
FIG. 35 is a diagram showing a configuration of a common source amplifier circuit of the invention.

In the case of using the aforementioned common source amplifier circuit as part of an operational amplifier, a capacitor or a resistor may be disposed in the common source amplifier circuit for the phase compensation of the operational amplifier. As an example, FIG. 35 shows a circuit diagram in which a capacitor 3501 is disposed between the input terminal 3208 and the drain terminal of the transistor TR3. Note that any element may be disposed anywhere as long as the phase compensation of the operational amplifier can be performed.

It should be noted that the description made in Embodiment Modes 1 and 2 can be applied to this embodiment mode. For example, the timing and frequency to perform the compensation operation is similar in this embodiment mode to Embodiment Modes 1 and 2.

Further, the reference voltage may be determined arbitrarily, therefore, a terminal to which is applied the reference voltage may be connected to other wiring, node, or terminal.

Further, the capacitor may hold the threshold voltage of the transistor instead of the voltage between the gate and source thereof.

Further, current that keeps flowing in the steady state may be interrupted for decreasing power consumption in this embodiment mode as well.

Further, the transistors used in this embodiment mode are mainly n-channel transistors, however, they may be p-channel transistors.

It should be noted that the invention is applied to the operational amplifier in this embodiment mode, however, it can be applied to such circuits as an OTA (Operational Transconductance Amplifier), a sense amplifier, or a comparator. Moreover, the invention can be applied to a circuit in which transistors are cascaded.

This embodiment mode can be freely combined with Embodiment Modes 1 and 2.

Embodiment Mode 4

In this embodiment mode, a method for saving time in using an electric circuit to which the invention is applied is described.

As described above, the circuit of the invention has two operating states. One is the compensation operation and the other is the normal operation. The compensation operation is not required to be performed frequently, however, it is required to be performed at least once before the normal operation is performed.

In the case where one circuit (for example, a source follower circuit) is disposed between a pair of input terminal and output terminal, the compensation operation may be performed at the following timings.

As one of the timings, the compensation operation is definitely performed before the normal operation is performed. For example, a certain period in which signals are inputted and outputted is divided into two periods. The compensation operation is performed in the first period and the normal operation is performed in the second period.

As a second timing, the compensation operation is performed in a period in which signals are not inputted or outputted and thereafter the normal operation is performed as many times as required.

As another timing, the normal operation is performed while the compensation operation is performed. In that case, only one circuit disposed between a pair of input terminal and output terminal is not enough to perform the compensation operation and the normal operation at the same time. Therefore, two circuits or more are disposed in parallel between the pair of input terminal and output terminal. Thus, the normal operation can be performed while the compensation operation is performed by controlling the operation of each disposed circuit.

Figure 8:
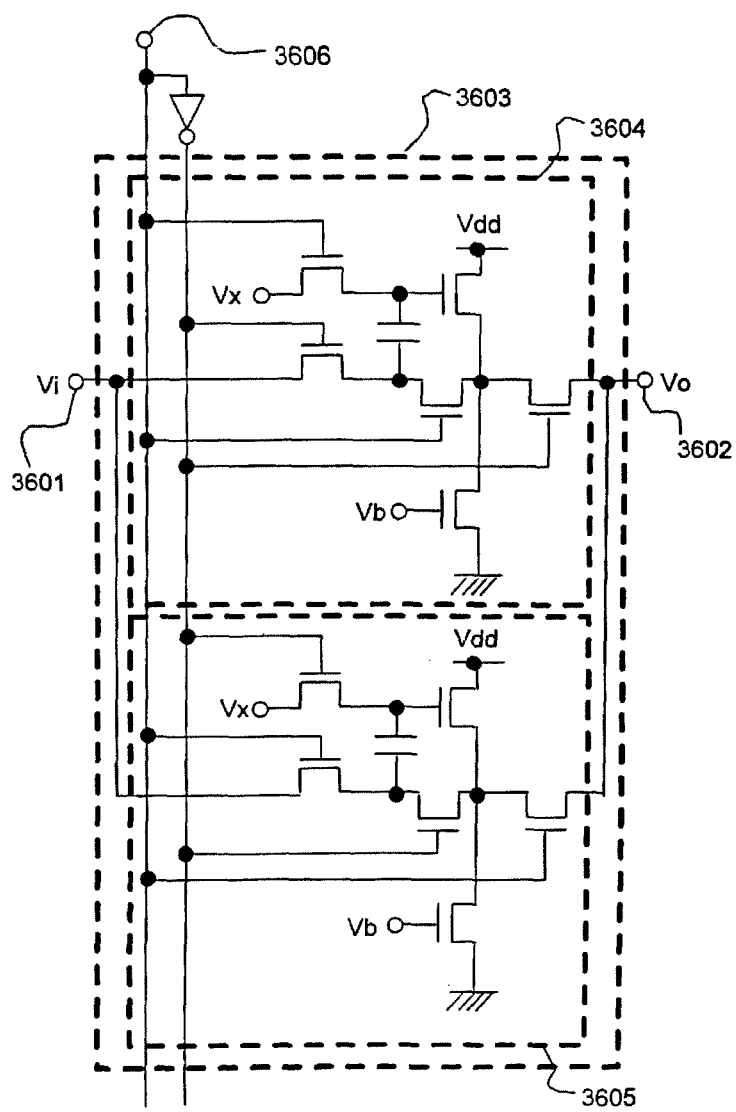
FIG. 8 is a diagram showing a configuration of a switching amplifier circuit of the invention.

FIG. 8 shows two source follower circuits disposed in parallel between a pair of input terminal and output terminal. A circuit 3603 is disposed between an input terminal 3601 and an output terminal 3602. The circuit 3603 includes source follower circuits 3604 and 3605. One of the source follower circuits performs the normal operation to output a signal to the output terminal 3602 while the other source follower circuit performs the compensation operation. A signal inputted to the terminal 3606 switches which source follower circuit to perform which operation. In FIG. 8, the source follower circuit 3604 performs the compensation operation when the terminal 3606 inputs a H signal, while the source follower circuit 3605 performs the compensation operation when the terminal 3606 inputs an L signal.

In this manner, the normal operation can be performed while the compensation operation is performed. By performing two operations at the same time, the operations can be performed efficiently without wasting time, which makes it possible to take enough time for each operation. Therefore, the compensation operation can be performed until the steady state is obtained, which enables an accurate compensation.

Note that the timing to perform the compensation operation is not limited to the abovementioned one.

FIG. 8 shows the case of using source follower circuits, however, two circuits or more can be disposed between a pair of input terminal and output terminal in other circuits such as a differential circuit and an operational amplifier as well.

It should be noted that this embodiment mode can be freely combined with Embodiment Modes 1 to 3.

Embodiment Mode 5

In this embodiment mode, configurations and operations of a display device, a signal driver circuit and the like are described. The circuit of the invention can be applied to a part of the signal driver circuit.

Figure 9:
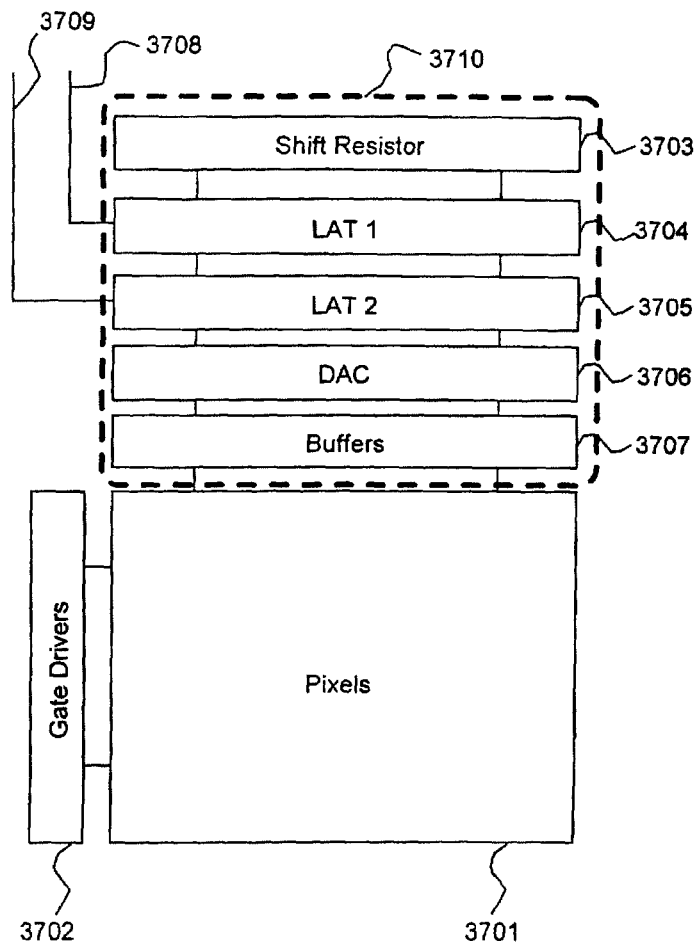
FIG. 9 is a diagram showing a configuration of a display device of the invention.

The display device shown in FIG. 9 includes pixels 3701, a gate driver circuit 3702, and a signal driver circuit 3710. The gate driver circuit 3702 outputs selection signals to the pixels 3701 sequentially. The signal driver circuit 3710 outputs video signals to the pixels 3701 sequentially. The pixels 3701 display an image by controlling light according to the video signals. The video signals inputted from the signal driver circuit 3710 to the pixels 3701 are often voltage. That is, display elements or elements for controlling the display elements disposed in the pixels are often the ones that change their states in accordance with the inputted video signals (voltage) from the signal driver circuit 3710. The display elements disposed in the pixels include a liquid crystal (LCD), an organic EL, an FED (Field Emission Display) and the like.

Note that a plurality of the gate driver circuits 3702 or the signal driver circuits 3710 may be disposed.

The configuration of the signal driver circuit 3710 can be divided into a plurality of portions. It can be briefly divided as an example into a shift register 3703, a first latch circuit 3704, a second latch circuit 3705, a digital/analog converter circuit 3706, and a buffer circuit (amplifier circuit) 3707.

The operation of the signal driver circuit 3710 is briefly described. The shift register 3703 includes a plurality of columns of flip-flop circuit (FF) and the like, to which a clock signal (S-CLK), a start pulse (SP), an inverted clock signal (S-CLKb) are inputted. Sampling pulses are outputted sequentially according to the timing of these signals.

The sampling pulses outputted from the shift register 3703 are inputted to the first latch circuit 3704. The first latch circuit 3704 is inputted a video signal from a video signal line 3708 which is stored in each column in accordance with the timing at which the sampling pulses are inputted. It should be noted that the video signal has a digital value when the digital/analog converter circuit 3706 is provided.

When video signals are held up to the last column in the first latch circuit 3704, a latch pulse is inputted form a latch control line 3709 in a horizontal retrace period. The video signals held in the first latch circuit 3704 are transferred to the second latch circuit 3705 all at once. After that, one row of the video signals held in the second latch circuit 3705 are inputted to the digital/analog converter circuit 3706 at a time. The signals outputted from the digital/analog converter circuit 3706 are inputted to the buffer circuit (amplifier circuit) 3707. Then, the signals are inputted from the buffer circuit (amplifier circuit) 3707 to the pixels 3701.

While the video signals held in the second latch circuit 3705 are inputted to the digital/analog converter circuit 3706 and to the pixels 3701, a sampling pulse is outputted from the shift register 3703 again. That is to say, two operations are performed at the same time. Accordingly, line sequential driving can be performed. The aforementioned operations are repeated further.

The invention can be applied to the buffer circuit (amplifier circuit) 3707 in the signal driver circuit 3710 in which the aforementioned operations are performed. The buffer circuit (amplifier circuit) 3707 is capable of supplying a large amount of current to the pixels 3711. That is to say, the buffer circuit (amplifier circuit) 3707 can convert impedance. A source follower circuit, a differential amplifier circuit, or an operational amplifier and the like can be used as this buffer circuit (amplifier circuit) 3707. In the case of using the differential amplifier circuit or operational amplifier, it can operate as a voltage follower circuit by connecting an output terminal to a negative input terminal to feed back the signals.

By disposing a plurality of source follower circuits, differential amplifier circuits, or operational amplifiers as shown in FIG. 8, the compensation operation and the normal operation can be performed at the same time.

In the case where the first latch circuit 3704 and the second latch circuit 3705 are capable of storing analog values, the digital/analog converter circuit 3706 can often be removed. Further, in the case where the data of binary digits, that is digital values are outputted to the pixels 3701, the digital/analog converter circuit 3706 can also be removed. The digital/analog converter circuit 3706 may include a gamma correction circuit. In this manner, the signal driver circuit 3710 may have a variety of configurations and not limited to FIG. 9.

Figure 10:
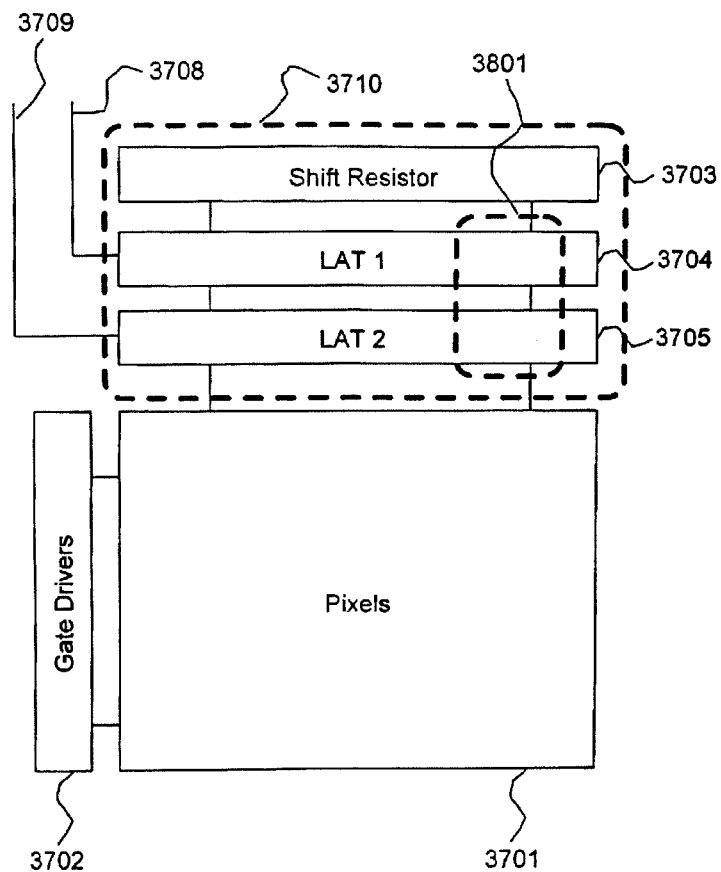
FIG. 10 is a diagram showing a configuration of a display device of the invention.
Figure 11:
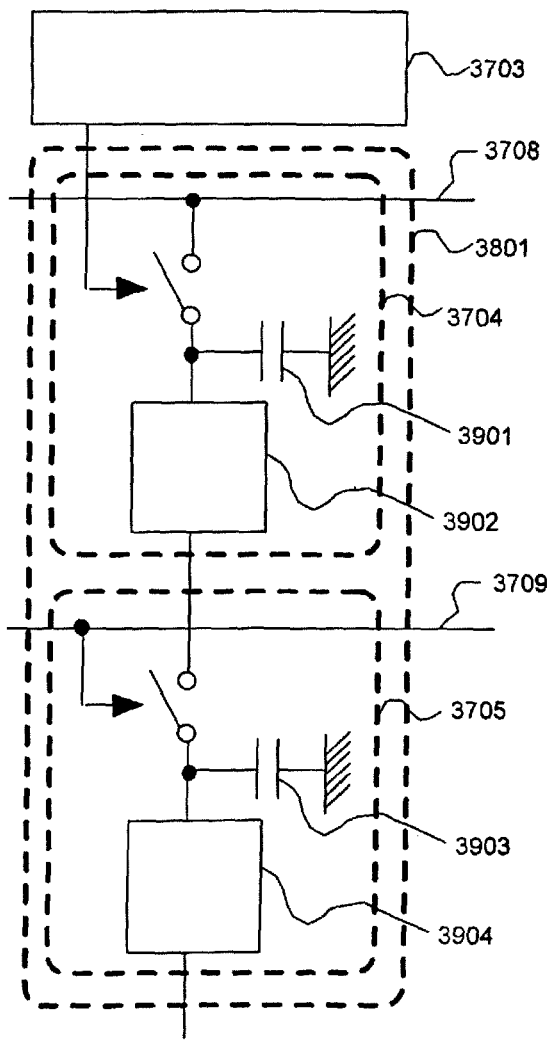
FIG. 11 is a diagram showing a configuration example of a signal driver circuit of the invention.

FIG. 10 shows the signal driver circuit 3710 in the case where the first latch circuit 3704 and the second latch circuit 3705 are capable of storing analog values. A video signal having analog value is inputted from the video signal line 3708. FIG. 11 shows an example of each column 3801 of the first latch circuit 3704 and the second latch circuit 3705. The example of each column 3801 includes one column of the first latch circuit 3704 and one column of the second latch circuit 3705. The one column of the first latch circuit 3704 includes a capacitor 3901 and a buffer circuit (amplifier circuit) 3902. The one column of the second latch circuit 3705 includes a capacitor 3903 and a buffer circuit (amplifier circuit) 3904.

Each column 3801 of the first latch circuit 3704 and the second latch circuit 3705 operates as follows. First, an analog video signal is inputted from the video signal line 3708 to the capacitor 3901 to be stored therein. The data stored in the capacitor 3901 is transferred to the capacitor 3903 by the signal from the latch control line 3709. At this time, the buffer circuit (amplifier circuit) 3902 converts the impedance. Therefore, the buffer circuit (amplifier circuit) 3902 can be removed by controlling the capacitances of the capacitors 3901 and 3902. The signals stored in the capacitor 3903 are outputted to the pixels via the buffer circuit (amplifier circuit) 3904.

Figure 12:
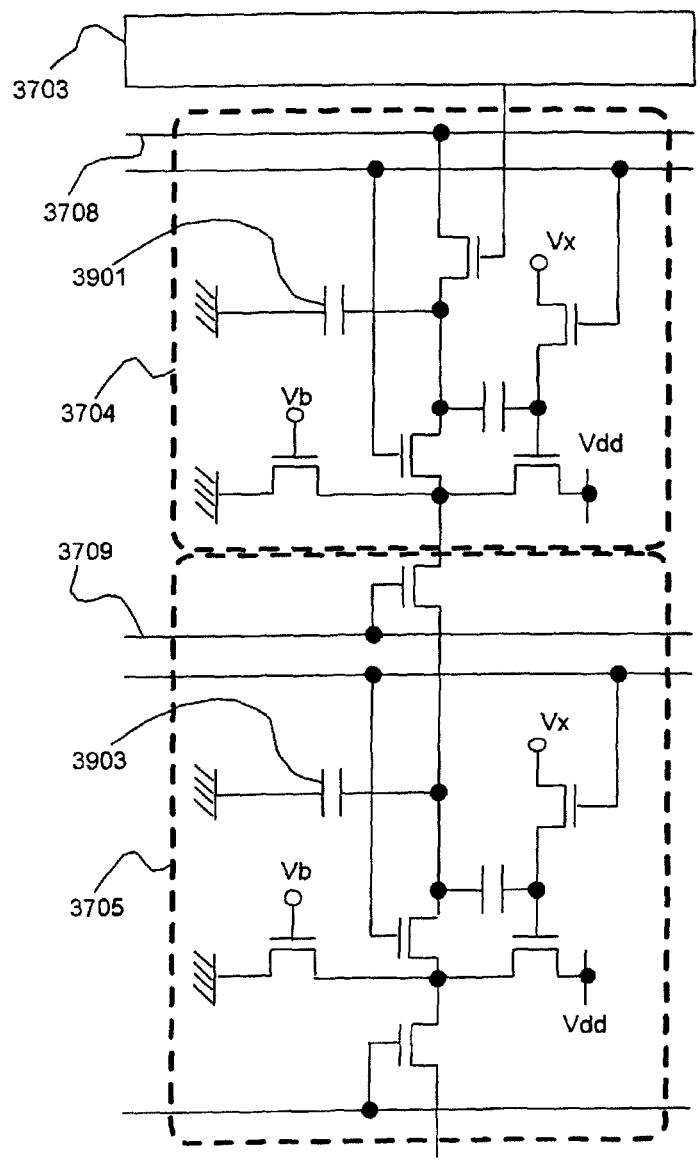
FIG. 12 is a diagram showing an example of a configuration of a signal driver circuit of the invention.

A source follower circuit, a differential amplifier circuit, operational amplifier and the like can be used as these buffer circuits (amplifier circuits) 3902 and 3904. FIG. 12 shows a circuit diagram of the buffer circuit (amplifier circuit) using source follower circuits as an example. As shown in FIG. 8, a plurality of buffer circuits (amplifier circuits) may be disposed so that the compensation operation and the normal operation can be performed at the same time.

Note that this embodiment mode can be freely combined with Embodiment Modes 1 to 4.

Embodiment Mode 6

In this embodiment mode, a layout of an electric circuit using the invention is described.

Figure 19:
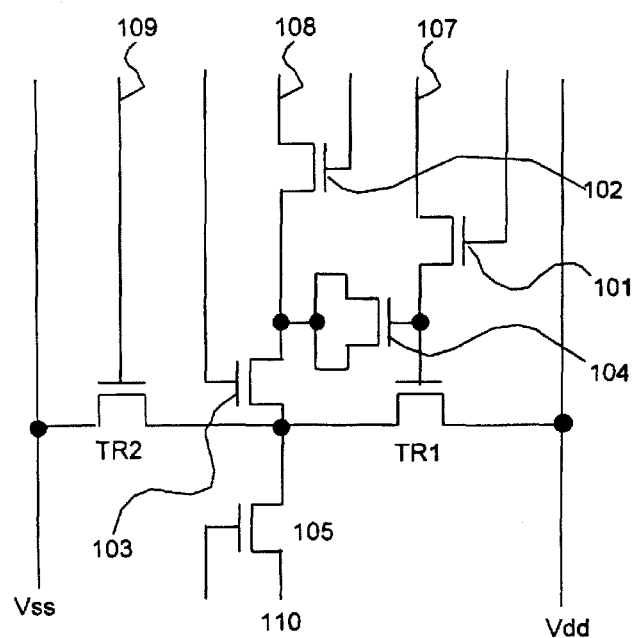
FIG. 19 is a diagram showing a configuration of a source follower circuit of the invention.

In this embodiment mode, the layout of a source follower circuit to which the invention is applied is described. FIG. 19 shows a circuit diagram of a source follower circuit of which layout is described similarly to FIG. 18.

In FIG. 19, the capacitor 104 is formed as a MOS capacitor. That is, when the MOS capacitor is considered as a transistor, the source terminal and the drain terminal thereof are connected and the node thereof becomes one terminal of the capacitor and the gate terminal thereof becomes the other terminal of the capacitor. Such a capacitor formed in this manner can have a large capacitance. It should be noted that the polarity of the capacitor 104 as a transistor is preferably the same as that of the transistor TR1. This is because the MOS capacitor as a transistor in this case is required to be ON since the capacitance becomes zero when it is OFF. Therefore, the capacitor 104 is required to have the same polarity as the transistor TR1 in order to be ON.

Figure 20:
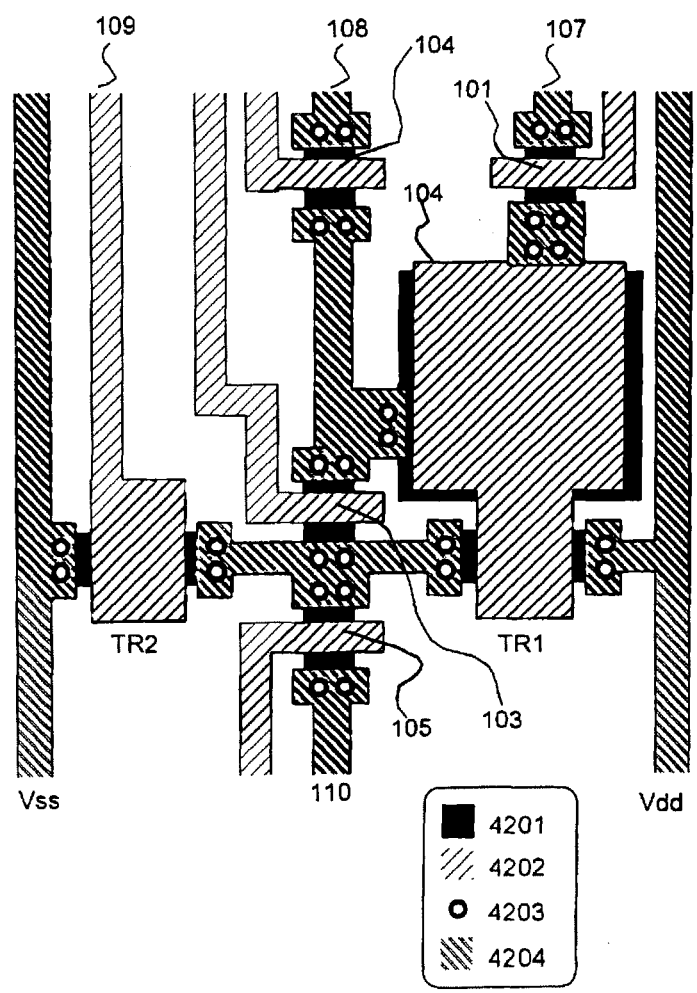
FIG. 20 is a diagram showing a layout of a source follower circuit of the invention.

FIG. 20 shows the layout of the source follower circuit of FIG. 19. A gate-insulating layer is formed on a semiconductor layer 4201 formed by polycrystalline silicon and the like, and a gate wirings (first wirings) 4202 formed thereon correspond to the transistors. An interlayer-insulating layer is formed on the gate wirings (first wirings) 4202 and second wirings 4204 is formed thereon. The second wirings 4204 and the semiconductor layer 4201, and the second wirings 4204 and the gate wirings (first wirings) 4202 are connected by opening contacts 4203.

With a known technology by applying such a layout as shown in FIG. 20, the electric circuit of the invention can be achieved.

It should be noted that the transistors TR1 and TR2 normally operate in a saturation region. In an ideal transistor, current flowing between the source and drain thereof does not change in a saturation region even when the voltage between the source and drain changes. In fact, however, current flowing between the source and drain of the transistor changes even in a saturation region because of such effect as the kink effect or Early effect, which causes an error. In order to decrease the kink effect and Early effect, the gate length L of the transistors TR1 and TR2 are designed long in FIG. 20. It should be noted that the kink effect and Early effect can be decreased by using other methods, for example, by additionally connecting a transistor in series to the transistors TR1 and TR2. Such methods can be applied to the invention as well.

Ideally, the voltage in the capacitor 104 does not change between the compensation operation and the normal operation. In fact, however, the voltage in the capacitor 104 is divided because of a parasitic capacitance (gate capacitance) of a transistor (the transistor TR1 here) of which gate terminal is connected to the capacitor 104. As a result, the voltage of the capacitor 104 slightly changes between the compensation operation and the normal operation, which causes an error. In order to reduce the error, the capacitor 104 is required to have a sufficiently larger capacitance than the parasitic capacitance (gate capacitance) of the transistor of which gate terminal is connected to the capacitor 104. Specifically, the capacitance of the capacitor 104 is preferably five times as large as the parasitic capacitance (gate capacitance) of the transistor of which gate terminal is connected to the capacitor 104 or more.

It should be noted that this embodiment can be freely combined with Embodiment Modes 1 to 5.

Embodiment Mode 7

Figure 36:
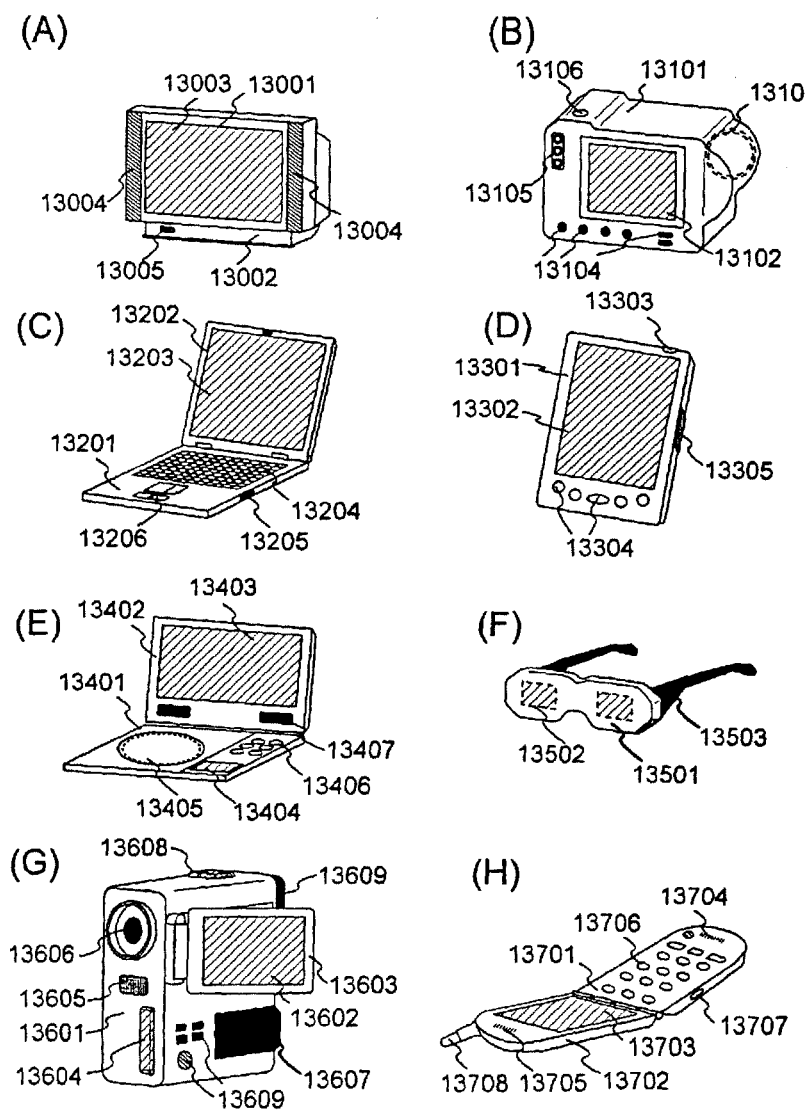
FIGS. 36A to 36H are views showing electric devices to which the invention is applied.

An electronic device using the invention includes a video camera, a digital camera, a goggle display (head mounted display), a navigation system, an audio reproducing device (such as car audio system and audio component system), a notebook personal computer, a game machine, a portable information terminal (such as mobile computer, mobile telephone, portable game machine, and electronic book) and an image reproducing device provided with a recording medium (specifically, a device provided with a display capable of reproducing the recording medium such as a digital versatile disc (DVD) and displaying an image thereof). FIG. 36 shows specific examples thereof.

FIG. 36(A) illustrates a display device including a housing 13001, a support base 13002, a display portion 13003, speaker portions 13004, a video input terminal 13005 and the like. The invention can be applied to an electric circuit forming the display portion 13003. According to the invention, the display device illustrated in FIG. 36(A) can be formed. The display portion 13003 can be applied to an organic EL display, a liquid crystal display and the like. The display device includes the entire display devices for displaying information, such as a personal computer, a receiver of TV broadcasting and an advertising display.

FIG. 36(B) illustrates a digital still camera including a body 13101, a display portion 13102, an image receiving portion 13013, operating keys 13104, an external connection port 13105, a shutter 13106 and the like. The invention can be applied to an electric circuit forming the display portion 13102. According to the invention, the digital still camera illustrated in FIG. 36(B) can be formed.

FIG. 36(C) illustrates a notebook personal computer including a body 13201, a housing 13202, a display portion 13203, a keyboard 13204, an external connection port 13205, a pointing mouse 13206 and the like. The invention can be applied to an electric circuit forming the display portion 13203. According to the invention, the display device illustrated in FIG. 36(C) can be formed.

FIG. 36(D) illustrates a mobile computer including a body 13301, a display portion 13302, a switch 13303, operating keys 13304, an infrared port 13305 and the like. The invention can be applied to an electric circuit forming the display portion 13302. According to the invention, the mobile computer illustrated in FIG. 36(D) can be formed.

FIG. 36(E) illustrates a portable image reproducing device provided with a recording medium (specifically, a DVD reproducing device) including a body 13401, a housing 13402, a display portion A13403, a display portion B13404, a recording medium (such as a DVD) reading portion 13405, an operating key 13406, a speaker portion 13407 and the like. The display portion A13403 mainly displays image data while the display portion B13404 mainly displays text data. The invention can be applied to electric circuits forming both of the display portions A13403 and B13404. It should be noted that the image reproducing device provided with a recording medium includes a domestic game machine and the like. According to the invention, the DVD reproducing device illustrated in FIG. 36(E) can be formed.

FIG. 36(F) illustrates a goggle display (head mounted display) including a body 3501, a display portion 13502, an arm portion 13503 and the like. The invention can be applied to an electric circuit forming the display portion 13502. According to the invention, the goggle display illustrated in FIG. 36(F) can be formed.

FIG. 36(G) illustrates a video camera including a body 13601, a display portion 13602, a housing 13603, an external connection port 13604, a remote control receiving portion 13605, an image receiving portion 13606, a battery 13607, an audio input portion 13608, operating keys 13609 and the like. The invention can be applied to an electric circuit forming the display portion 13602. According to the invention, the video camera illustrated in FIG. 36G can be formed.

FIG. 36(H) illustrates a portable phone including a body 13701, a housing 13702, a display portion 13703, an audio input portion 13704, an audio output portion 13705, operating keys 13706, an external connection port 13707, an antenna 13708 and the like. The invention can be applied to an electric circuit forming the display portion 13703. It should be noted that the power consumption of the display portion 13703 in the portable phone can be suppressed by displaying white text on black background. According to the invention, the portable phone illustrated in FIG. 36(H) can be formed.

It should be noted that the light including the outputted image data can be applied to a front or rear projection system by expanding it using a lens and the like for projection provided that the display material has a higher light-emitting luminance in the future.

Furthermore, the aforementioned electric devices are more likely to display information distributed through telecommunication lines such as internet, CATV (cable TV) and the like, in particular moving image data. As the light-emitting material has a quite fast response, a light-emitting device is preferable for displaying moving images.

The light-emitting device consumes power in a light-emitting portion, therefore, it is preferable that the light emitting portion is as small as possible when displaying the data. Therefore, in the case of using the light-emitting device in a display portion such as a portable information terminal, in particular a portable phone and an audio reproducing device that mainly display text data, it is preferable to form the text data with the light emitting portions on a non-light emitting portion as a background.

As described above, the application range of the invention is quite wide and the invention can be applied to a variety of electronic devices. The electric devices described in this embodiment mode can employ any electric circuit or semiconductor device described in Embodiment Modes 1 to 6.

In the invention, the gate terminal of the transistor is applied voltage in which voltage stored in the capacitor is added to the input voltage, not just the input voltage only. The voltage stored in the capacitor has a potential corresponding to the current characteristics and the size of the transistor. Therefore, when the current characteristics and the size of the transistor vary, the voltage stored in the capacitor changes accordingly. As a result, an effect of variation of the transistor can be decreased.

An operation to store voltage in a capacitor, that is the compensation operation may be performed at least once. Then, the effect of variation in characteristics of the transistor can be decreased in the subsequent normal operation. Therefore, drive timing is not made complicated and a simple operation can be obtained.

Moreover, as the numbers of capacitors and switches are small, only a small area is occupied for the layout. As a result, the manufacturing yield does not easily drop and downsizing of a device can be achieved.

What is claimed is:

1. An electronic device comprising:
an input terminal;
an output terminal;
a first switch;
a second switch;
a third switch;
a fourth switch;
a fifth switch;
a first wiring;
a second wiring;
a third wiring;
a first transistor; and
a second transistor,
wherein a first terminal of the first switch is directly connected with the first wiring,
wherein a second terminal of the first switch is directly connected with a first terminal of the first transistor,
wherein a second terminal of the first transistor is directly connected with a first terminal of the second transistor,
wherein a second terminal of the second transistor is directly connected with the second wiring,
wherein a first terminal of the second switch is directly connected with the third wiring,
wherein a second terminal of the second switch is directly connected with a gate of the first transistor,
wherein a first terminal of the third switch is directly connected with the input terminal,
wherein a second terminal of the third switch is directly connected with a first terminal of the fourth switch,
wherein a second terminal of the fourth switch is directly connected with the second terminal of the first transistor,
wherein a first terminal of the fifth switch is directly connected with the second terminal of the first transistor, and
wherein a second terminal of the fifth switch is directly connected with the output terminal.

2. An electronic device comprising:
an input terminal;
an output terminal;
a first switch;
a second switch;
a third switch;
a fourth switch;
a fifth switch;
a first power supply line;
a second power supply line;
a wiring;
a first transistor; and
a second transistor,
wherein a first terminal of the first switch is directly connected with the first power supply line,
wherein a second terminal of the first switch is directly connected with a first terminal of the first transistor,
wherein a second terminal of the first transistor is directly connected with a first terminal of the second transistor,
wherein a second terminal of the second transistor is directly connected with the second power supply line,
wherein a first terminal of the second switch is directly connected with the wiring,
wherein a second terminal of the second switch is directly connected with a gate of the first transistor,
wherein a first terminal of the third switch is directly connected with the input terminal,
wherein a second terminal of the third switch is directly connected with a first terminal of the fourth switch,
wherein a second terminal of the fourth switch is directly connected with the second terminal of the first transistor,
wherein a first terminal of the fifth switch is directly connected with the second terminal of the first transistor, and
wherein a second terminal of the fifth switch is directly connected with the output terminal.

3. An electronic device comprising:
an input terminal;
an output terminal;
a first transistor;
a second transistor;
a third transistor;
a fourth transistor;
a fifth transistor;
a sixth transistor;
a seventh transistor;
a first wiring;
a second wiring; and
a third wiring,
wherein a first terminal of the first transistor is directly connected with the first wiring,
wherein a second terminal of the first transistor is directly connected with a first terminal of the sixth transistor,
wherein a second terminal of the sixth transistor is directly connected with a first terminal of the seventh transistor,
wherein a second terminal of the seventh transistor is directly connected with the second wiring,
wherein a first terminal of the second transistor is directly connected with the third wiring,
wherein a second terminal of the second transistor is directly connected with a gate of the sixth transistor,
wherein a first terminal of the third transistor is directly connected with the input terminal,
wherein a second terminal of the third transistor is directly connected with a first terminal of the fourth transistor,
wherein a second terminal of the fourth transistor is directly connected with the second terminal of the sixth transistor,
wherein a first terminal of the fifth transistor is directly connected with the second terminal of the sixth transistor, and
wherein a second terminal of the fifth transistor is directly connected with the output terminal.

4. The electronic device according to claim 1, wherein the potential of the first wiring is always equal to or higher than the potential of the second wiring.

5. The electronic device according to claim 2, wherein the potential of the first power supply line is always equal to or higher than the potential of the second power supply line.

6. The electronic device according to claim 3, wherein the potential of the first wiring is always equal to or higher than the potential of the second wiring.

7. The electronic device according to claim 1, wherein both of the first transistor and the second transistor are n-channel type.

8. The electronic device according to claim 2, wherein both of the first transistor and the second transistor are n-channel type.

9. The electronic device according to claim 3, wherein both of the sixth transistor and the seventh transistor are n-channel type.

10. The electronic device according to claim 1, wherein both of the first transistor and the second transistor are thin film transistors.

11. The electronic device according to claim 2, wherein both of the first transistor and the second transistor are thin film transistors.

12. The electronic device according to claim 3, wherein both of the sixth transistor and the seventh transistor are thin film transistors.

13. The electronic device according to claim 1, wherein all of the first switch, the second switch, the third switch, the fourth switch and the fifth switch are thin film transistors.

14. The electronic device according to claim 2, wherein all of the first switch, the second switch, the third switch, the fourth switch and the fifth switch are thin film transistors.

15. The electronic device according to claim 3, wherein all of the first transistor, the second transistor, the third transistor, the fourth transistor and the fifth transistor are thin film transistors.

16. The electronic device according to claim 1, further comprising one selected from the group consisting of an antenna, an operating key, a speaker, a battery, external connection port and a microphone.

17. The electronic device according to claim 2, further comprising one selected from the group consisting of an antenna, an operating key, a speaker, a battery, external connection port and a microphone.

18. The electronic device according to claim 3, further comprising one selected from the group consisting of an antenna, an operating key, a speaker, a battery, external connection port and a microphone.

19. The electronic device according to claim 1, further comprising a capacitor,
   wherein a first terminal of the capacitor is directly connected with the gate of the sixth transistor, and
   wherein a second terminal of the capacitor is directly connected with the first terminal of the fourth transistor.

20. The electronic device according to claim 2, further comprising a capacitor,
   wherein a first terminal of the capacitor is directly connected with the gate of the sixth transistor, and
   wherein a second terminal of the capacitor is directly connected with the first terminal of the fourth transistor.

21. The electronic device according to claim 3, further comprising a capacitor,
   wherein a first terminal of the capacitor is directly connected with the gate of the sixth transistor, and
   wherein a second terminal of the capacitor is directly connected with the first terminal of the fourth transistor.

* * * * *